(12) United States Patent
Lu

(10) Patent No.: US 11,114,335 B1
(45) Date of Patent: Sep. 7, 2021

(54) SEMICONDUCTOR DEVICE STRUCTURE WITH AIR GAP STRUCTURE AND METHOD FOR FORMING THE SAME

(71) Applicant: NANYA TECHNOLOGY CORPORATION, New Taipei (TW)

(72) Inventor: Li-Han Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/848,291

(22) Filed: Apr. 14, 2020

(51) Int. Cl.
  *H01L 21/768* (2006.01)
  *H01L 27/108* (2006.01)

(52) U.S. Cl.
  CPC .... *H01L 21/7682* (2013.01); *H01L 27/10814* (2013.01); *H01L 27/10823* (2013.01); *H01L 27/10888* (2013.01)

(58) Field of Classification Search
  CPC .......... H01L 21/7682; H01L 27/10814; H01L 27/10888; H01L 27/10823; H01L 29/0649; H01L 29/0653; H01L 2221/1042; H01L 2221/1047; H01L 29/4991
  See application file for complete search history.

(56) References Cited

U.S. PATENT DOCUMENTS

| | | | | |
|---|---|---|---|---|
| 2010/0032637 A1* | 2/2010 | Kinoshita | ............. | H01L 45/144 257/2 |
| 2015/0372060 A1* | 12/2015 | Terai | ................... | H01L 27/2463 257/4 |

* cited by examiner

Primary Examiner — Selim U Ahmed
(74) Attorney, Agent, or Firm — Muncy, Geissler, Olds & Lowe, P.C.

(57) ABSTRACT

The present disclosure provides a semiconductor device structure with an air gap structure and a method for forming the semiconductor device structure. The semiconductor device structure includes a first conductive contact and a second conductive contact disposed over a semiconductor substrate. The semiconductor device structure also includes a first dielectric layer surrounding the first conductive contact and the second conductive contact, and a second dielectric layer disposed over the first conductive contact, the second conductive contact and the first dielectric layer. The first dielectric layer is separated from the semiconductor substrate by a first air gap structure, the first dielectric layer is separated from the second dielectric layer by a second air gap structure, and the air gap structures reduce capacitive coupling between conductive features.

20 Claims, 23 Drawing Sheets

SEMICONDUCTOR DEVICE STRUCTURE WITH AIR GAP STRUCTURE AND METHOD FOR FORMING THE SAME

TECHNICAL FIELD

The present disclosure relates to a semiconductor device structure and a method for forming the same, and more particularly, to a semiconductor device structure with an air gap structure for reducing capacitive coupling between conductive features and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as increased parasitic capacitance between adjacent conductive elements, which results in increased power consumption and unwanted resistive-capacitive (RC) delay (i.e., signal delay). Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first conductive contact and a second conductive contact disposed over a semiconductor substrate. The semiconductor device structure also includes a first dielectric layer surrounding the first conductive contact and the second conductive contact, and a second dielectric layer disposed over the first conductive contact, the second conductive contact and the first dielectric layer. The first dielectric layer is separated from the semiconductor substrate by a first air gap structure, and the first dielectric layer is separated from the second dielectric layer by a second air gap structure.

In an embodiment, the first dielectric layer, the first air gap structure and the second air gap structure extend between the first conductive contact and the second conductive contact. In an embodiment, the first dielectric layer is in direct contact with the first conductive contact and the second conductive contact. In an embodiment, the semiconductor device structure further includes a first energy removable structure disposed between the first dielectric layer and the semiconductor substrate, wherein the first air gap structure is enclosed by the first energy removable structure. In an embodiment, the first energy removable structure is in direct contact with the first conductive contact, the second conductive contact, the first dielectric layer and an isolation structure in the semiconductor substrate. In an embodiment, the semiconductor device structure further includes a second energy removable structure disposed between the first dielectric layer and the second dielectric layer, wherein the second air gap structure is enclosed by the second energy removable structure. In an embodiment, the second energy removable structure is in direct contact with the first conductive contact, the second conductive contact, the first dielectric layer and the second dielectric layer. In an embodiment, the semiconductor device structure further includes a first bit line and a second bit line disposed over the second dielectric layer, wherein the first bit line is electrically connected to a first source/drain region in the semiconductor substrate through the first conductive contact, and the second bit line is electrically connected to a second source/drain region in the semiconductor substrate through the second conductive contact.

In another embodiment of the present disclosure, a semiconductor device structure is provided. The semiconductor device structure includes a first conductive contact disposed over a first source/drain region of a semiconductor substrate. The semiconductor device structure also includes a first energy removable structure adjoins a lower portion of a sidewall of the first conductive contact. A first air gap structure is enclosed by the first energy removable structure. The semiconductor device structure further includes a second energy removable structure adjoins an upper portion of the sidewall of the first conductive contact. A second air gap structure is enclosed by the second energy removable structure. In addition, the semiconductor device structure includes a first dielectric layer disposed between the first energy removable structure and the second energy removable structure. The first dielectric layer adjoins a middle portion of the sidewall of the first conductive contact.

In an embodiment, the first conductive contact is surrounded by the first energy removable structure, the first dielectric layer and the second energy removable structure. In an embodiment, the first dielectric layer is in direct contact with the first energy removable structure and the second energy removable structure. In an embodiment, the semiconductor device structure further includes a second conductive contact disposed over a second source/drain region of the semiconductor substrate, wherein the second conductive contact is surrounded by the first energy removable structure, the first dielectric layer and the second energy removable structure. In an embodiment, the first air gap structure and the second air gap structure extend between the first conductive contact and the second conductive contact. In an embodiment, the semiconductor device structure further includes a conductive via disposed over the first conductive contact, and a second dielectric layer disposed over the second energy removable structure, wherein the conductive via is surrounded by the second dielectric layer, and the first conductive contact is partially covered by the second dielectric layer. In an embodiment, the second air gap structure is separated from the second dielectric layer by the second energy removable structure.

In yet another embodiment of the present disclosure, a method for forming a semiconductor device structure is provided. The method includes forming a first energy removable layer over a semiconductor substrate, and forming a first dielectric layer over the first energy removable layer. The method also includes forming a second energy removable layer over the first dielectric layer, and forming a conductive contact penetrating through the first energy removable layer, the first dielectric layer and the second energy removable layer. The method further includes performing a heat treatment process to transform the first energy removable layer into a first energy removable structure and to transform the second energy removable layer into a second energy removable structure. A first air gap structure is enclosed by the first energy removable structure and a second air gap structure is enclosed by the second energy removable structure.

In an embodiment, a material of the first energy removable layer is the same as a material of the second energy removable layer, and the first air gap structure overlaps the second air gap structure in a top view. In an embodiment, the step of forming the conductive contact includes etching the first energy removable layer, the first dielectric layer and the second energy removable layer to form an opening exposing a source/drain region in the semiconductor substrate, and forming the conductive contact in the opening before the heat treatment process is performed. In an embodiment, the method further includes forming a second dielectric layer over the second energy removable layer and the conductive contact before the heat treatment process is performed. In an embodiment, the method further includes forming a conductive via over the conductive contact after the heat treatment process is performed, wherein the conductive via is surrounded by the second dielectric layer. In addition, the method includes forming a bit line over the conductive via, wherein a portion of the second dielectric layer extends between the bit line and the conductive contact, and the bit line is electrically connected to a source/drain region in the semiconductor substrate through the conductive via and the conductive contact.

Embodiments of a semiconductor device structure are provided in the disclosure. The semiconductor device structure includes a conductive contact over a semiconductor substrate, a first dielectric layer surrounding the conductive contact, and a second dielectric layer over the conductive contact. The first dielectric layer is separated from the semiconductor substrate by a first air gap structure, and the first dielectric layer is separated from the second dielectric layer by a second air gap structure. Therefore, the parasitic capacitance between the conductive contact and another adjacent conductive element may be reduced, and the first dielectric layer may provide additional structural support to the semiconductor device structure. As a result, the overall device performance may be improved, and the yield rate of the semiconductor device structure may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
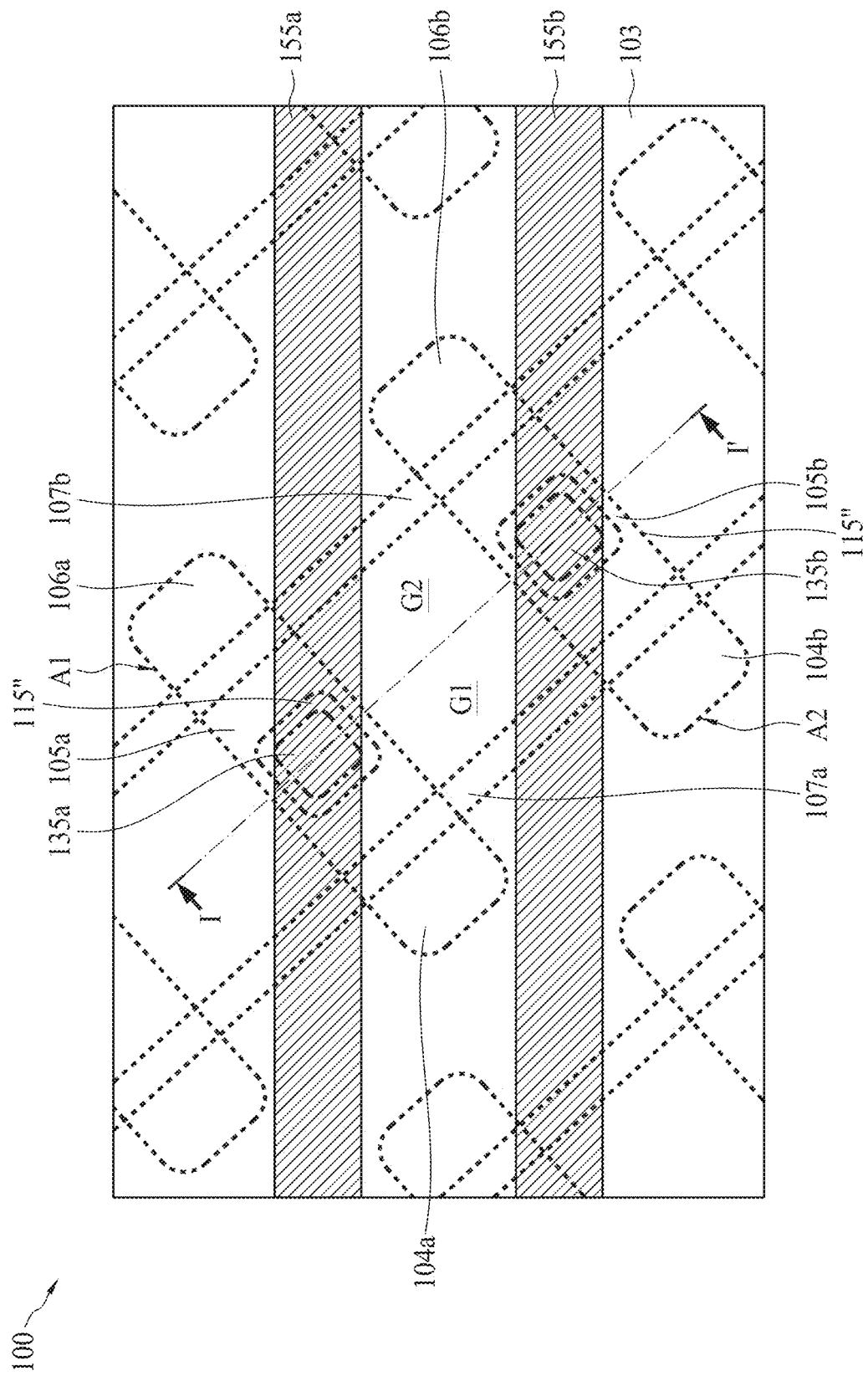
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
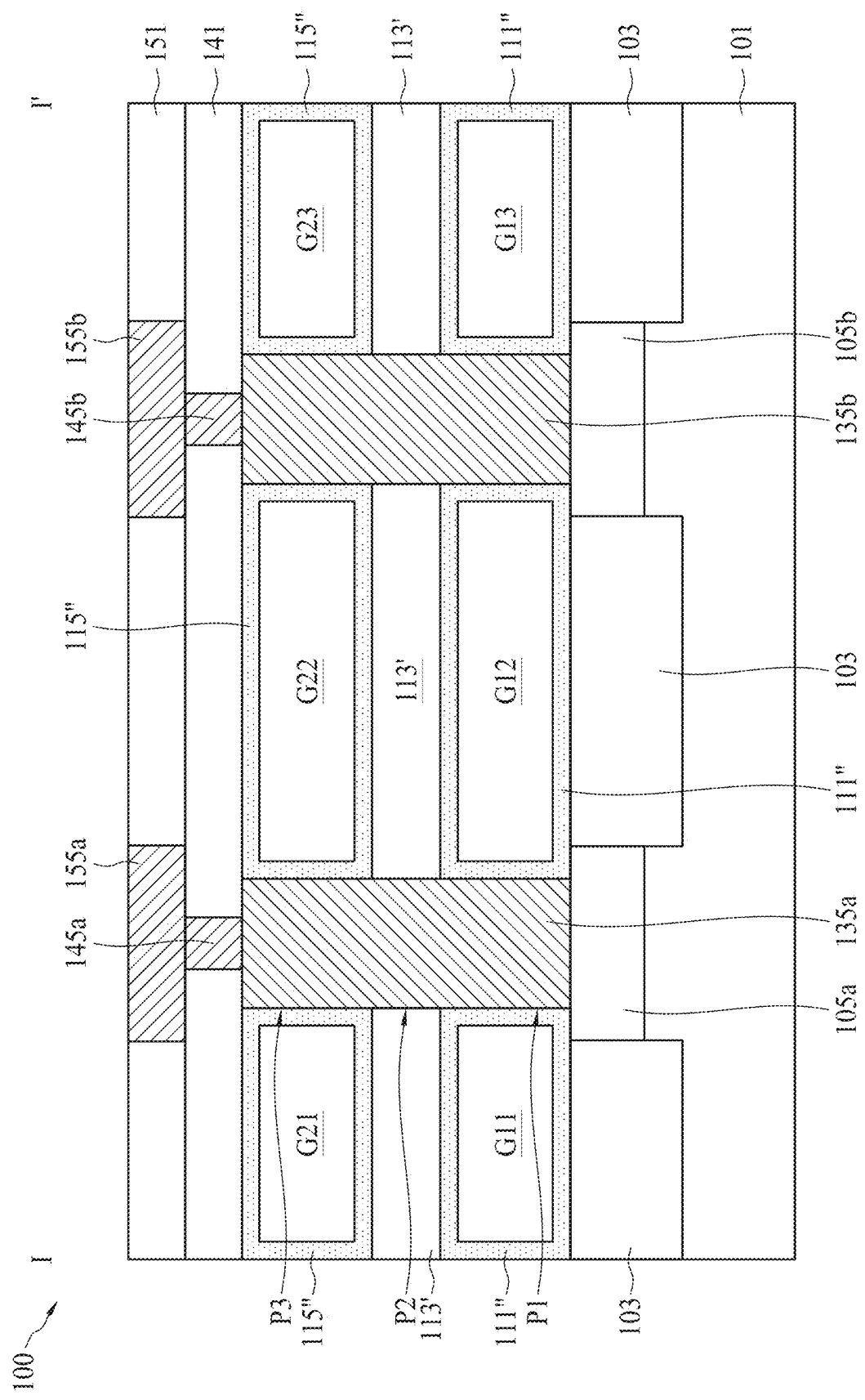
FIG. 2 is a cross-sectional view illustrating the semiconductor device structure along the sectional line I-I' in FIG. 1, in accordance with some embodiments.

FIG. 1 is a top view illustrating a semiconductor device structure 100, and FIG. 2 is a cross-sectional view illustrating the semiconductor device structure 100 along the sectional line I-I' in FIG. 1, in accordance with some embodiments. The semiconductor device structure 100 includes a plurality of active areas (e.g., active areas A1 and A2), a plurality of word lines (e.g., word lines 107a and 107b), and a plurality of bit lines (e.g., bit lines 155a and 155b), as shown in FIGS. 1 and 2 in accordance with some embodiments.

In some embodiments, the active areas (e.g., active areas A1 and A2) are defined by an isolation structure 103 in a semiconductor substrate 101, and the word lines (e.g., word lines 107a and 107b) are buried in the semiconductor substrate 101. In some embodiments, each of the active areas is intersected by two word lines, and each of the active areas has a source/drain (S/D) region between the two word lines and two other S/D regions at both sides of the active area. For example, the active area A1 has an S/D region 105a between the word lines 107a and 107b, and S/D regions 104a and 106a at both sides of the active area A1. Similarly, the active area A2 has an S/D region 105b between the word lines 107a and 107b, and S/D regions 104b and 106b at both sides of the active area A2.

In some embodiments, the semiconductor device structure 100 also includes a conductive contact 135a disposed over the S/D region 105a of the active area A1, and a conductive contact 135b disposed over the S/D region 105b of the active area A2. Moreover, the conductive contacts 135a and 135b are surrounded by a first energy removable structure 111", a first dielectric layer 113' and a second energy removable structure 115". The first dielectric layer 113' is disposed over the first energy removable structure 111", and the second energy removable structure 115" is disposed over the first dielectric layer 113'. It should be noted that a first air gap structure G1 (including three portions G11, G12 and G13) is enclosed by the first energy removable structure 111", and a second air gap structure G2 (including three portions G21, G22 and G23) is enclosed by the second energy removable structure 115". In some embodiments, the portions G11, G12 and G13 are connected to each other, and the portions G21, G22 and G23 are connected to each other.

In some embodiments, as shown in FIG. 2, the first energy removable structure 111" adjoins a lower portion P1 of the sidewall of the conductive contact 135a, the first dielectric layer 113' adjoins a middle portion P2 of the sidewall of the conductive contact 135a, and the second energy removable structure 115" adjoins an upper portion P3 of the sidewall of the conductive contact 135a. In some embodiments, the conductive contacts 135a and 135b are in direct contact with the first energy removable structure 111", the first dielectric layer 113' and the second energy removable structure 115".

In some embodiments, the semiconductor device structure 100 further includes a conductive via 145a disposed over the conductive contact 135a and a conductive via 145b disposed over the conductive contact 135b, and a second dielectric layer 141 surrounding the conductive vias 145a and 145b. In addition, the semiconductor device structure 100 includes bit lines 155a and 155b disposed over the second dielectric layer 141, and a third dielectric layer 151 surrounding the bit lines 155a and 155b.

As shown in FIGS. 1 and 2, the bit line 155a is electrically connected to the S/D region 105a of the active area A1 through the conductive via 145a and the conductive contact 135a, and the bit line 155b is electrically connected to the S/D region 105b of the active area A2 through the conductive via 145b and the conductive contact 135b, in accordance with some embodiments. In the present embodiment, the semiconductor device structure 100 is a dynamic random access memory (DRAM), and the S/D regions 104a, 104b, 106a and 106b are electrically connected to respective capacitors (not shown). Similar to the conductive contacts 135a and 135b, the conductive contacts which electrically connect the S/D regions 104a, 104b, 106a, 106b to respective capacitors, may be surrounded by the first air gap structure G1, the first dielectric layer 113', and the second air gap structure G2.

Figure 3:
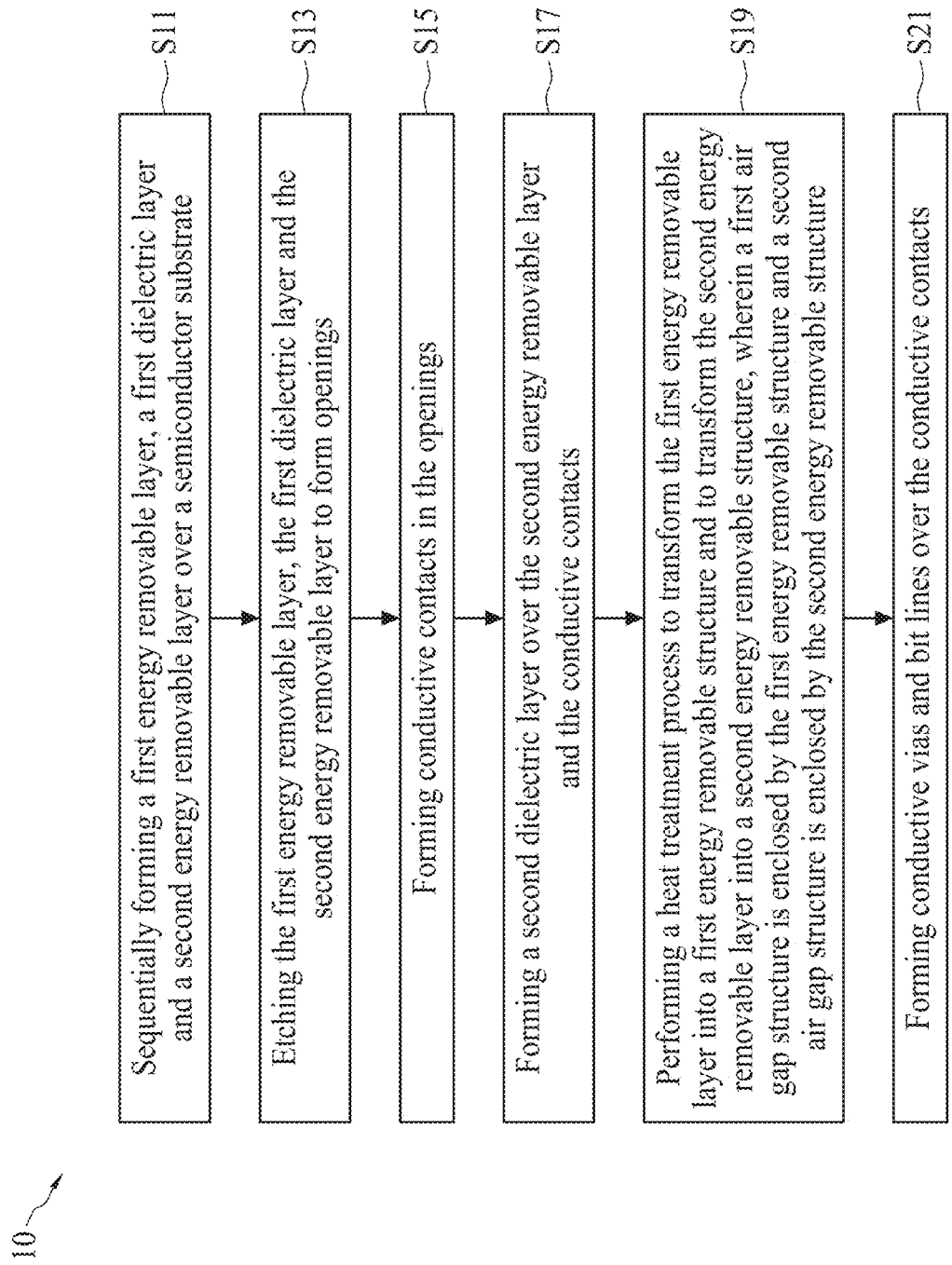
FIG. 3 is a flow diagram illustrating a method of forming a semiconductor device structure, in accordance with some embodiments.

FIG. 3 is a flow diagram illustrating a method 10 of forming the semiconductor device structure 100, and the method 10 includes steps S11, S13, S15, S17, S19 and S21, in accordance with some embodiments. The steps S11 to S21 of FIG. 3 are elaborated in connection with following figures.

FIGS. 4, 6, 8, 10, 12, 14 and 16 are top views illustrating intermediate stages in the formation of the semiconductor device structure 100, and FIGS. 5, 7, 9, 11, 13, 15 and 17 are cross-sectional views illustrating intermediate stages in the formation of the semiconductor device structure 100, in accordance with some embodiments. It should be noted that FIGS. 5, 7, 9, 11, 13, 15 and 17 are cross-sectional views along the sectional line I-I' of FIGS. 4, 6, 8, 10, 12, 14 and 16, respectively.

Figure 4:
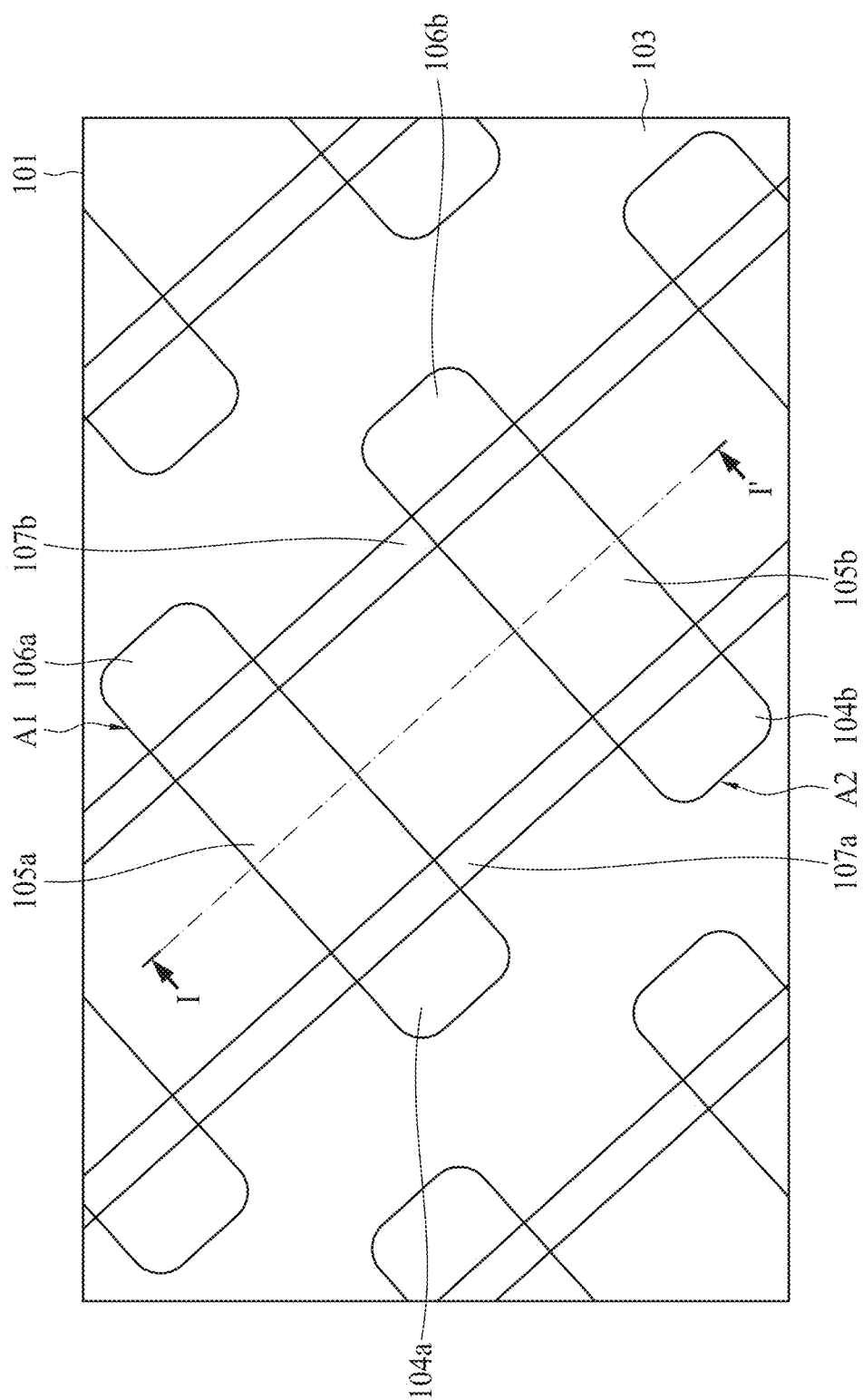
FIG. 4 is a top view illustrating an intermediate stage of forming active areas and isolation structures during the formation of the semiconductor device structure, in accordance with some embodiments.
Figure 5:
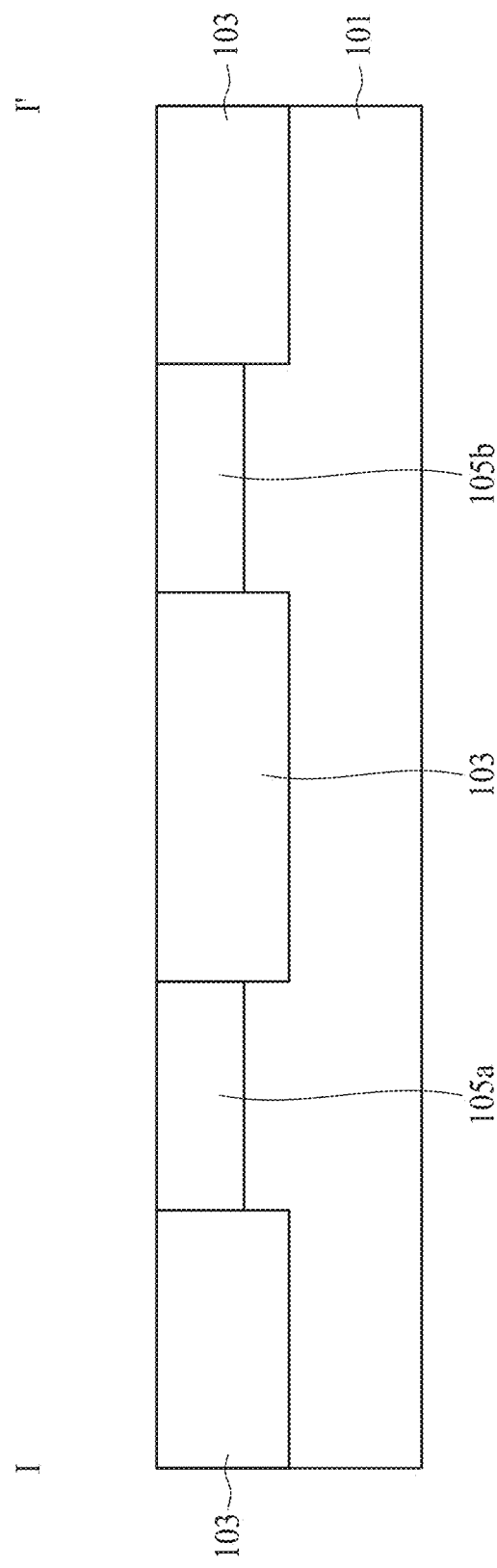
FIG. 5 is a cross-sectional view illustrating an intermediate stage of forming active areas and isolation structures during the formation of the semiconductor device structure along the sectional line I-I' in FIG. 4, in accordance with some embodiments.

As shown in FIGS. 4 and 5, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIGS. 4 and 5, the isolation structure 103 is formed in the semiconductor substrate 101, and the isolation structure 103 is a shallow trench isolation (STI) structure, in accordance with some embodiments. In addition, the isolation structure 103 may be made of silicon oxide, silicon nitride, silicon oxynitride or another applicable dielectric material, and the formation of the isolation structure 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and polishing the dielectric material until the semiconductor substrate 101 is exposed.

Moreover, the S/D regions (e.g., the S/D regions 104a, 104b, 105a, 105b, 106a and 106b) are formed in the active areas A1 and A2 defined by the isolation structure 103, and the word lines (e.g., the word lines 107a and 107b) are formed in the semiconductor substrate 101. In some embodiments, the S/D regions are formed by one or more ion implantation processes, and P-type dopants, such as boron (B), gallium (Ga), or indium (In), or N-type dopants, such as phosphorous (P) or arsenic (As), can be implanted in the active areas to form the S/D regions.

In some embodiments, each of the word lines includes a gate insulating layer (not shown) and a buried gate electrode (not shown) separated from the semiconductor substrate 101 by the gate insulating layer. The materials of the gate insulating layers may include silicon oxide, silicon nitride, silicon oxynitride, dielectric material(s) with high dielectric constant (high-k), or a combination thereof, and the materials of the buried gate electrodes may include aluminum (Al), copper (Cu), tungsten (W), titanium (Ti), tantalum (Ta), or another conductive material. Moreover, the word lines may be formed by patterning and deposition processes. Some processes used to form the word lines are similar to, or the same as, those used to form the isolation structure 103, and details thereof are not repeated herein. In some embodiments, the word lines are formed after the S/D regions.

Figure 6:
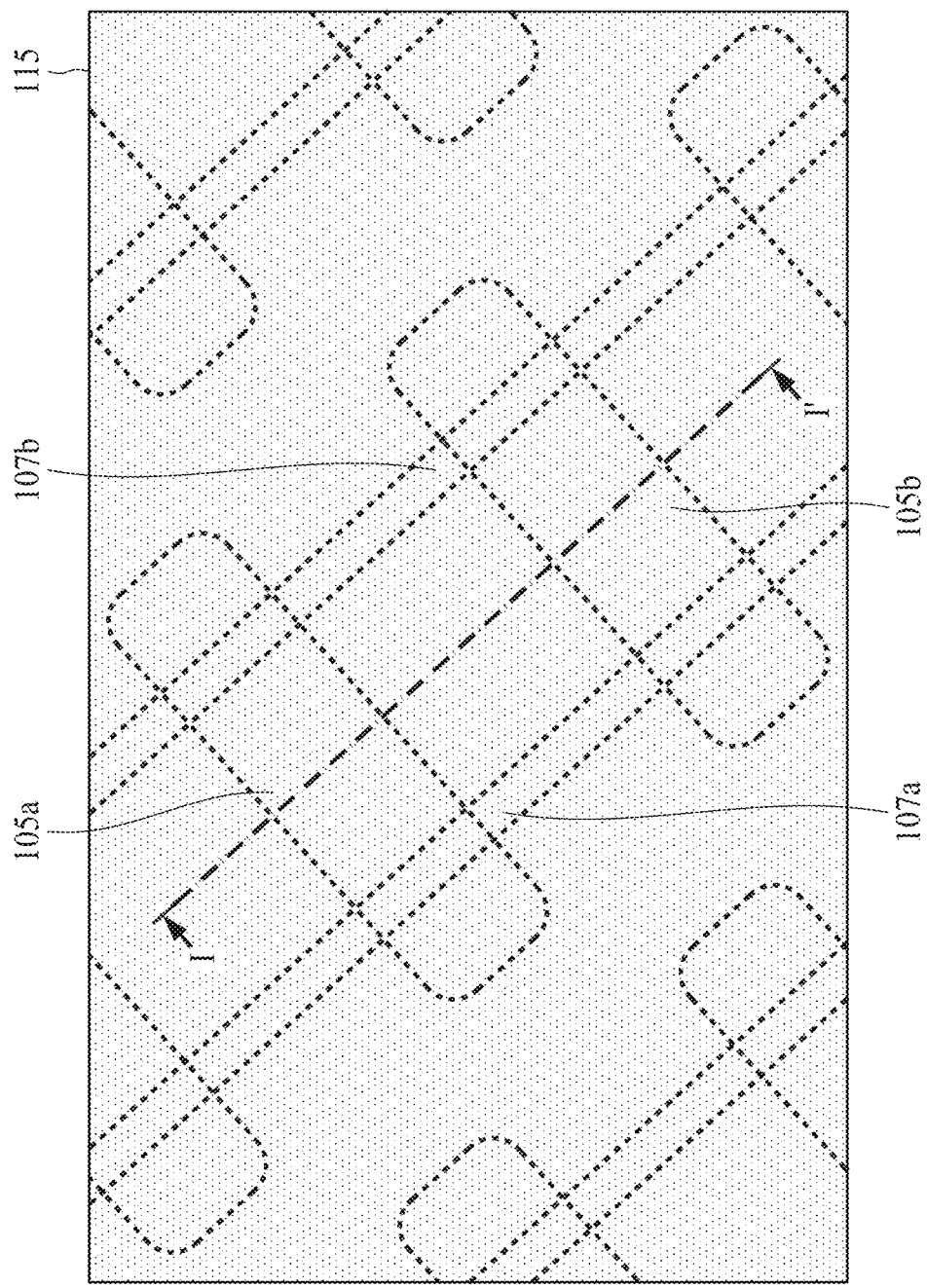
FIG. 6 is a top view illustrating an intermediate stage of forming energy removable layers during the formation of the semiconductor device structure, in accordance with some embodiments.
Figure 7:
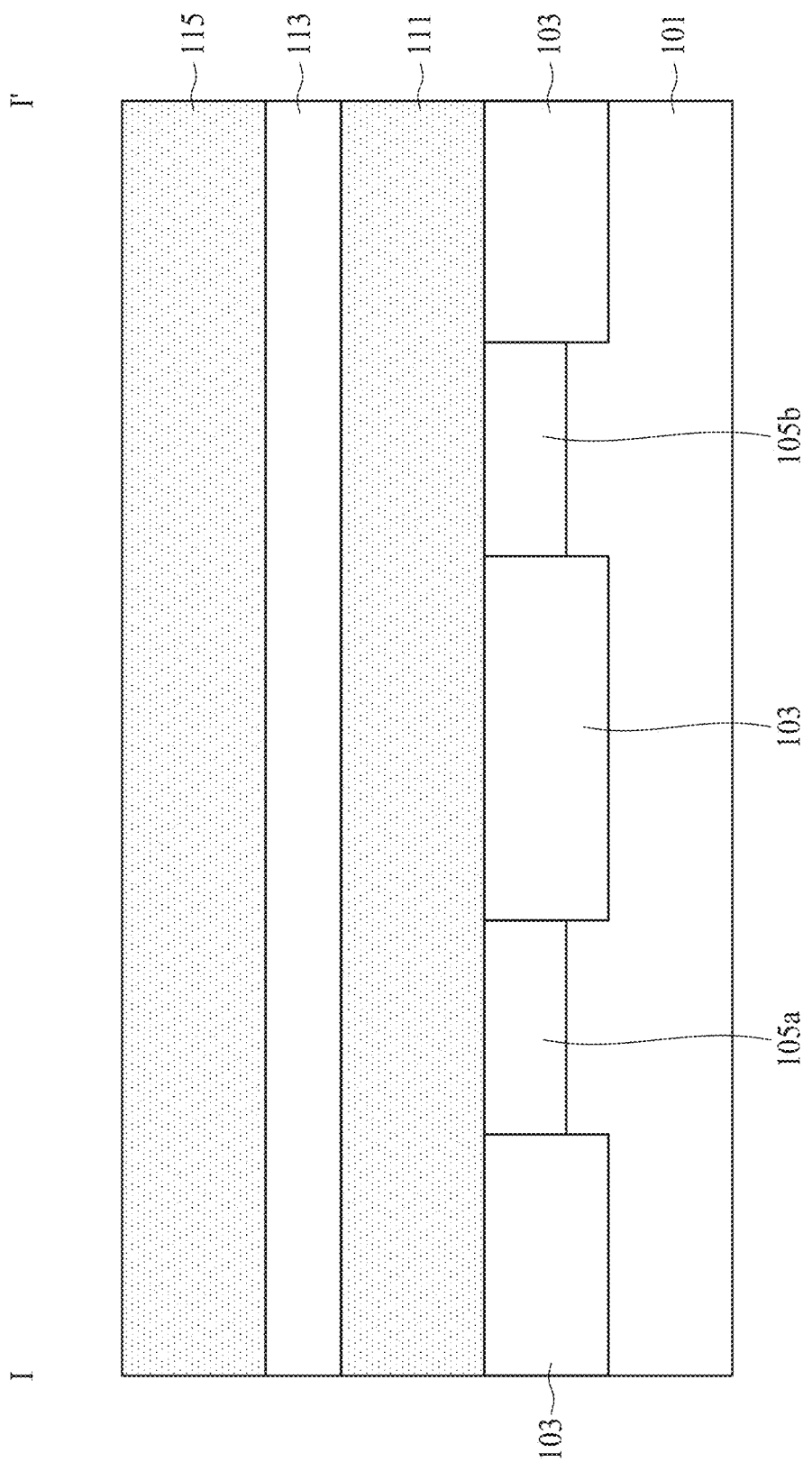
FIG. 7 is a cross-sectional view illustrating an intermediate stage of forming energy removable layers during the formation of the semiconductor device structure along the sectional line I-I' in FIG. 6, in accordance with some embodiments.

Next, as shown in FIGS. 6 and 7, the first energy removable layer 111, the first dielectric layer 113 and the second energy removable layer 115 are sequentially formed over the semiconductor substrate 101, in accordance with some embodiments. The respective step is illustrated as the step S11 in the method 10 shown in FIG. 3.

In some embodiments, the first energy removable layer 111 and the second energy removable layer 115 are formed by the same material. In some embodiments, the materials of the first energy removable layer 111 and the second energy removable layer 115 include a thermal decomposable material. In some other embodiments, the materials of the first energy removable layer 111 and the second energy removable layer 115 include a photonic decomposable material, an e-beam decomposable material, or another applicable energy decomposable material. Specifically, in some embodiments, the materials of the first energy removable layer 111 and the second energy removable layer 115 include a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the space originally occupied by the first energy removable layer 111 and the second energy removable layer 115 in the subsequent processes.

In addition, the first dielectric layer 113 is made of silicon oxide, silicon nitride, silicon oxynitride, or multilayers thereof. In some embodiments, the first dielectric layer 113 is made of a low-k dielectric material. In addition, the first energy removable layer 111, the first dielectric layer 113 and the second energy removable layer 115 may be formed by deposition processes. In some embodiments, the deposition processes include chemical vapor deposition (CVD), physical vapor deposition (PVD), atomic layer deposition (ALD), spin-coating, or another applicable process.

Figure 8:
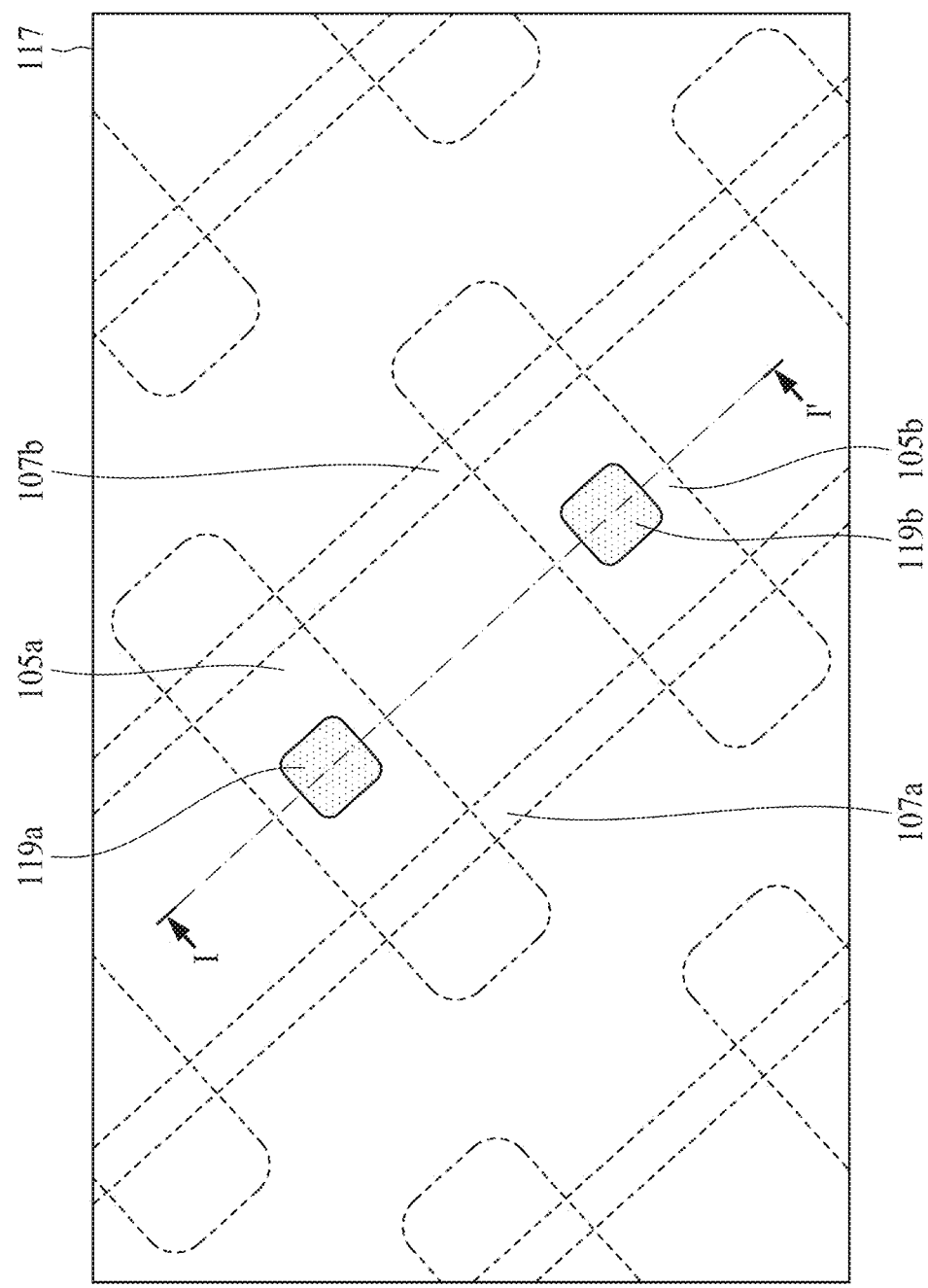
FIG. 8 is a top view illustrating an intermediate stage of forming a patterned mask during the formation of the semiconductor device structure, in accordance with some embodiments.
Figure 9:
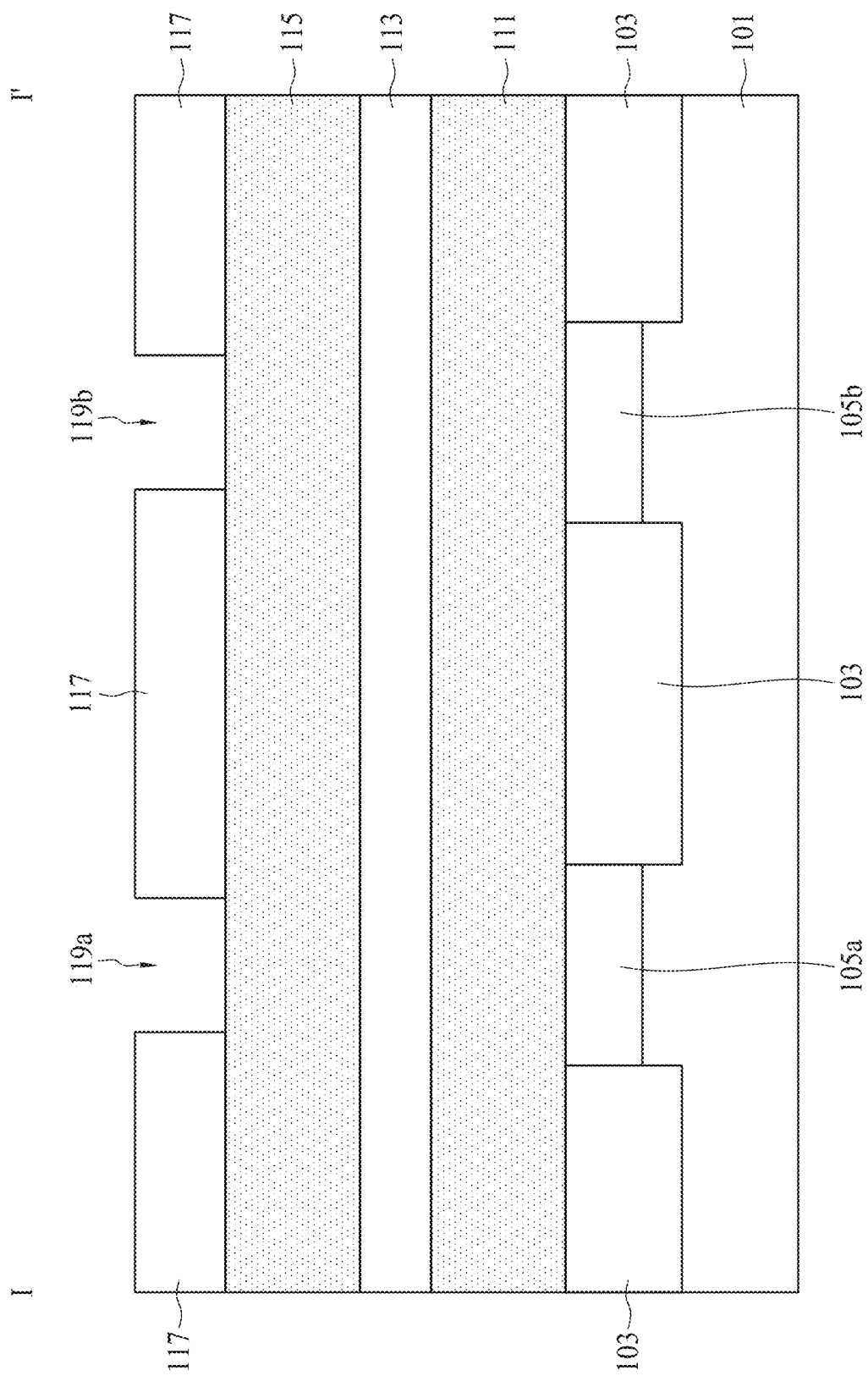
FIG. 9 is a cross-sectional view illustrating an intermediate stage of forming a patterned mask during the formation of the semiconductor device structure along the sectional line I-I' in FIG. 8, in accordance with some embodiments.

Then, a patterned mask 117 is formed over the second energy removable layer 115, as shown in FIGS. 8 and 9 in accordance with some embodiments. In some embodiments, the patterned mask 117 has openings 119a and 119b, and portions of the second energy removable layer 115 are exposed by the openings 119a and 119b of the patterned mask 117.

The patterned mask 117 may be formed by a deposition process and a patterning process. The deposition process for forming the patterned mask 117 may be a CVD process, a high-density plasma CVD (HDPCVD) process, a spin-coating process, or another applicable process. The patterning process for forming the patterned mask 117 may include a photolithography process and an etching process. The photolithography process may include photoresist coating (e.g., spin-coating), soft baking, mask aligning, exposure, post-exposure baking, developing the photoresist, rinsing and drying (e.g., hard baking). The etching process may include a dry etching process or a wet etching process.

Figure 10:
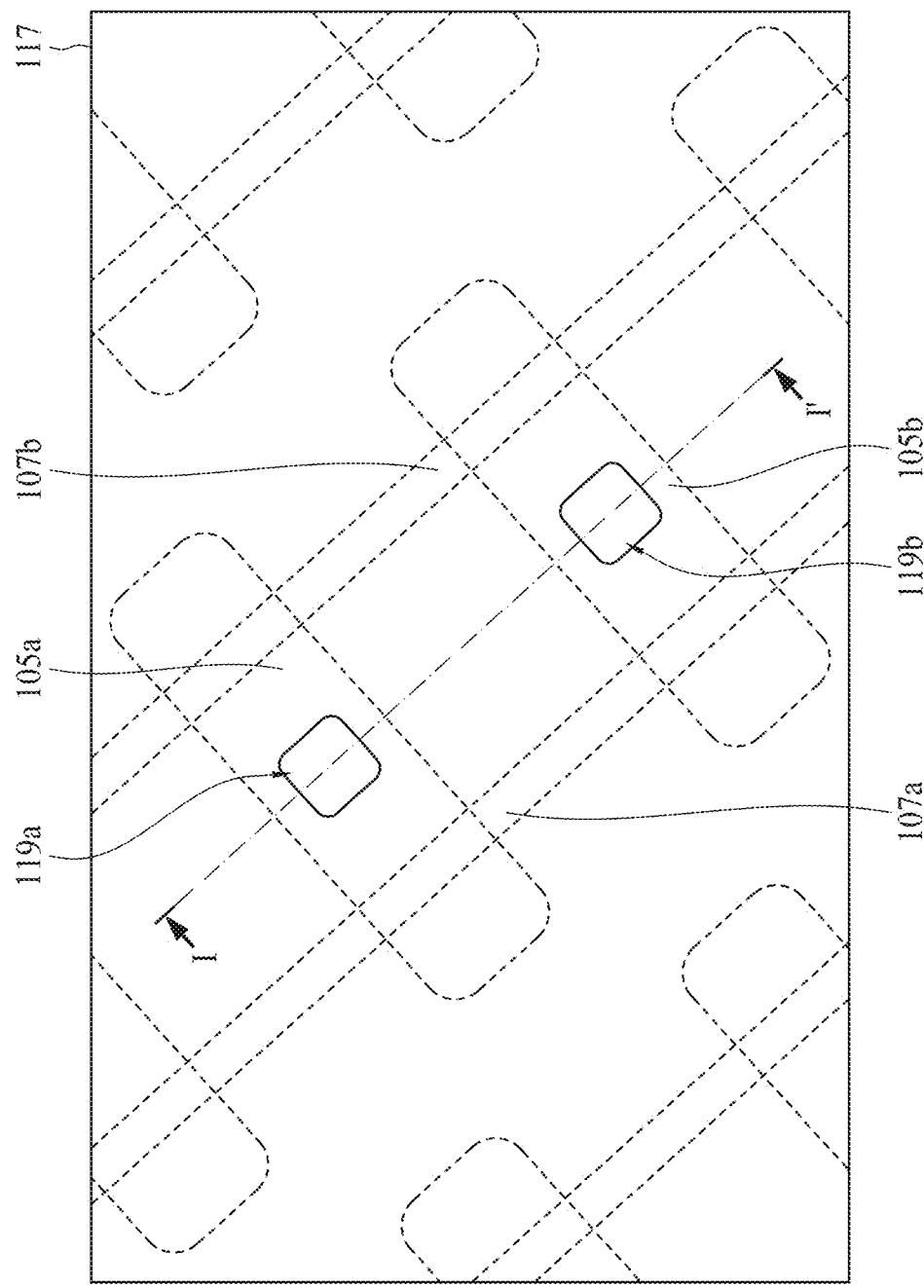
FIG. 10 is a top view illustrating an intermediate stage of forming openings in the energy removable layers during the formation of the semiconductor device structure, in accordance with some embodiments.
Figure 11:
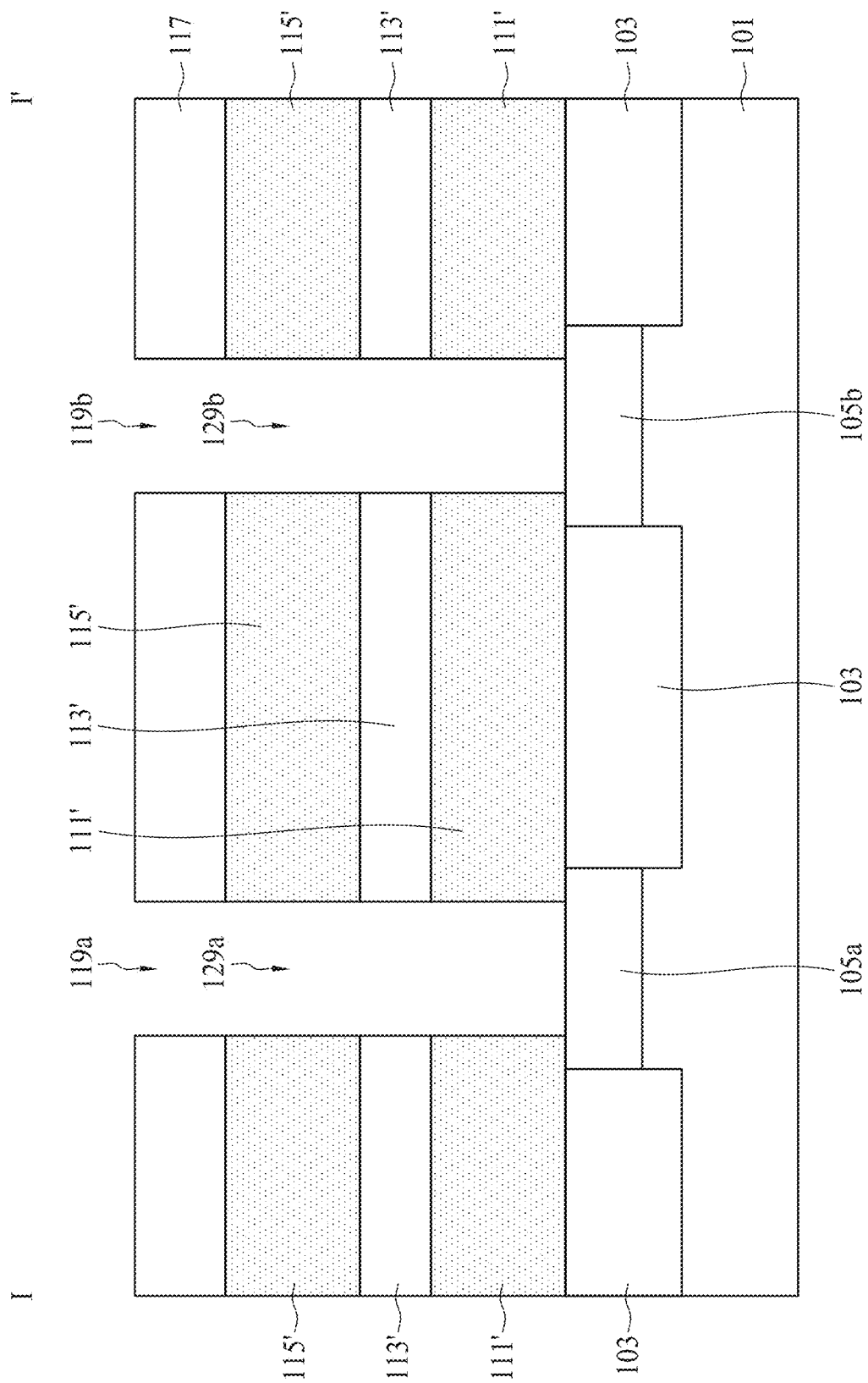
FIG. 11 is a cross-sectional view illustrating an intermediate stage of forming openings in the energy removable layers during the formation of the semiconductor device structure along the sectional line I-I' in FIG. 10, in accordance with some embodiments.

Subsequently, an etching process is performed on the second energy removable layer 115, the first dielectric layer 113 and the first energy removable layer 111 using the patterned mask 117 as a mask, as shown in FIGS. 10 and 11 in accordance with some embodiments. After the etching process, openings 129a and 129b are formed, and an (etched) first energy removable layer 111', an (etched) first dielectric layer 113' and an (etched) second energy removable layer 115' are obtained. The respective step is illustrated as the step S13 in the method 10 shown in FIG. 3.

In some embodiments, the openings 129a and 129b penetrate through the first energy removable layer 111', the first dielectric layer 113' and the second energy removable layer 115', and the S/D regions 105a and 105b are exposed by the openings 129a and 129b, respectively. In some embodiments, the S/D regions 105a and 105b are partially exposed by the openings 129a and 129b, and portions of the S/D regions 105a and 105b remain covered by the first energy removable layer 111', the first dielectric layer 113' and the second energy removable layer 115'.

Figure 12:
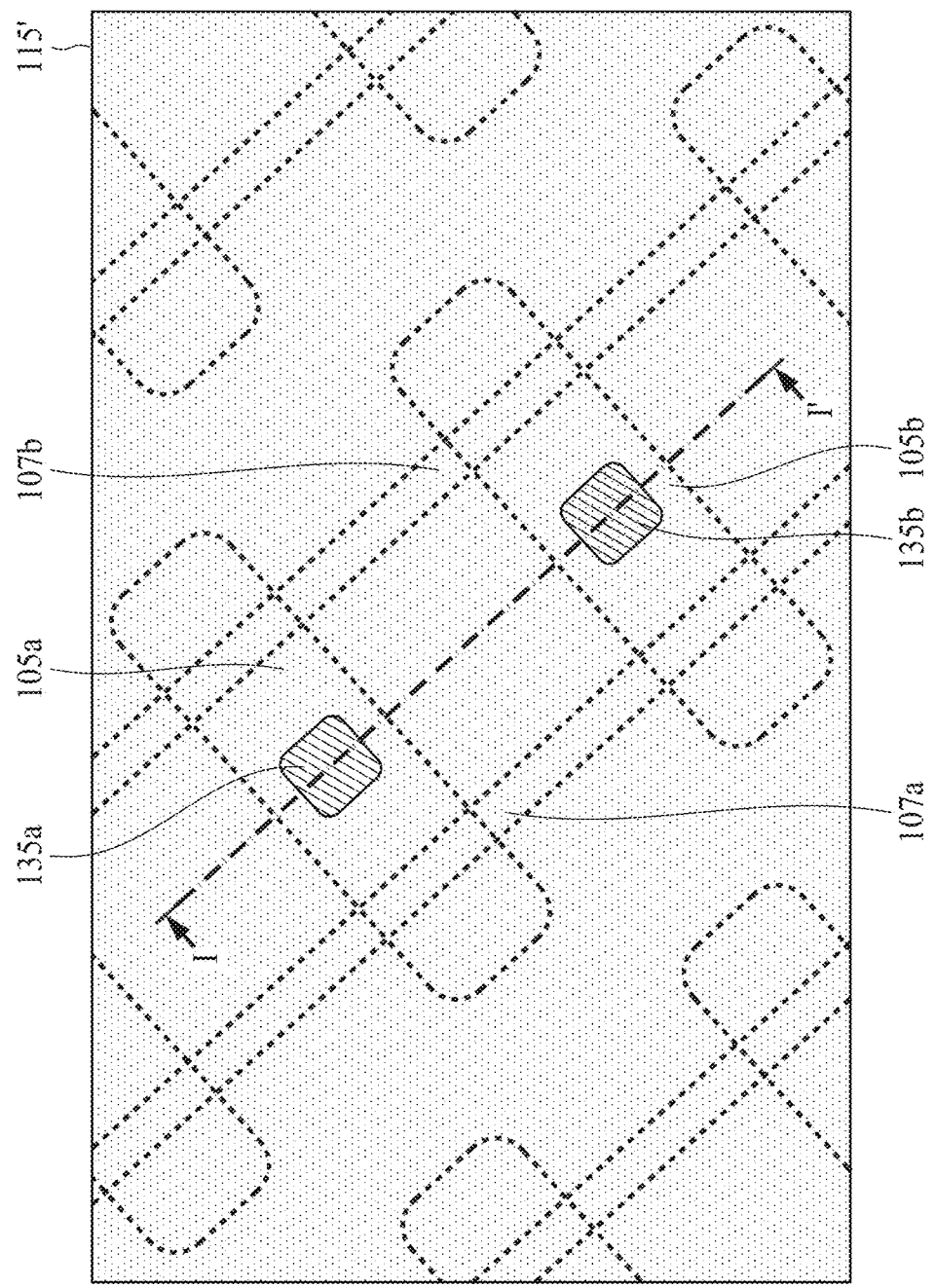
FIG. 12 is a top view illustrating an intermediate stage of forming conductive contacts in the openings during the formation of the semiconductor device structure, in accordance with some embodiments.
Figure 13:
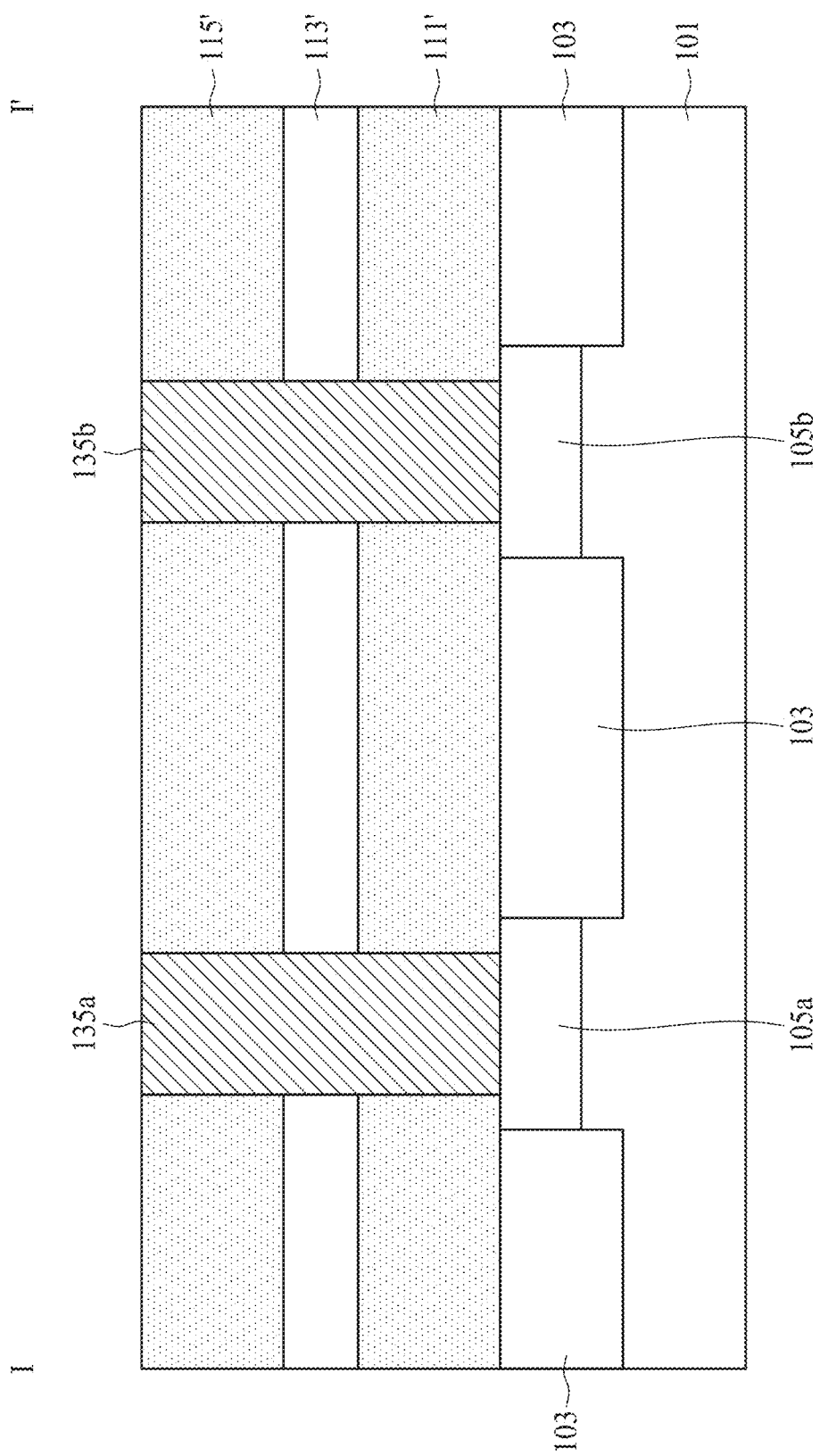
FIG. 13 is a cross-sectional view illustrating an intermediate stage of forming conductive contacts in the openings during the formation of the semiconductor device structure along the sectional line I-I' in FIG. 12, in accordance with some embodiments.

Next, the openings 129a and 129b are filled by the conductive contacts 135a and 135b, as shown in FIGS. 12 and 13 in accordance with some embodiments. The respective step is illustrated as the step S15 in the method 10 shown in FIG. 3. In addition, the patterned mask 117 is removed.

In some embodiments, the conductive contacts 135a and 135b are made of copper (Cu), copper alloy, aluminum (Al), aluminum alloy, tungsten (W), tungsten alloy, titanium (Ti), titanium alloy, tantalum (Ta), tantalum alloy, another applicable conductive material, or a combination thereof. The formation of the conductive contacts 135a and 135b may include depositing a conductive material (not shown) in the openings 119a, 119b, 129a, 129b and over the patterned mask 117, and performing a planarization process to remove the patterned mask 117 and the excess portions of the conductive material, such that the second energy removable layer 115' is exposed. In some embodiments, the patterned mask 117 is removed before the conductive material is filled in the openings 129a and 129b.

Figure 14:
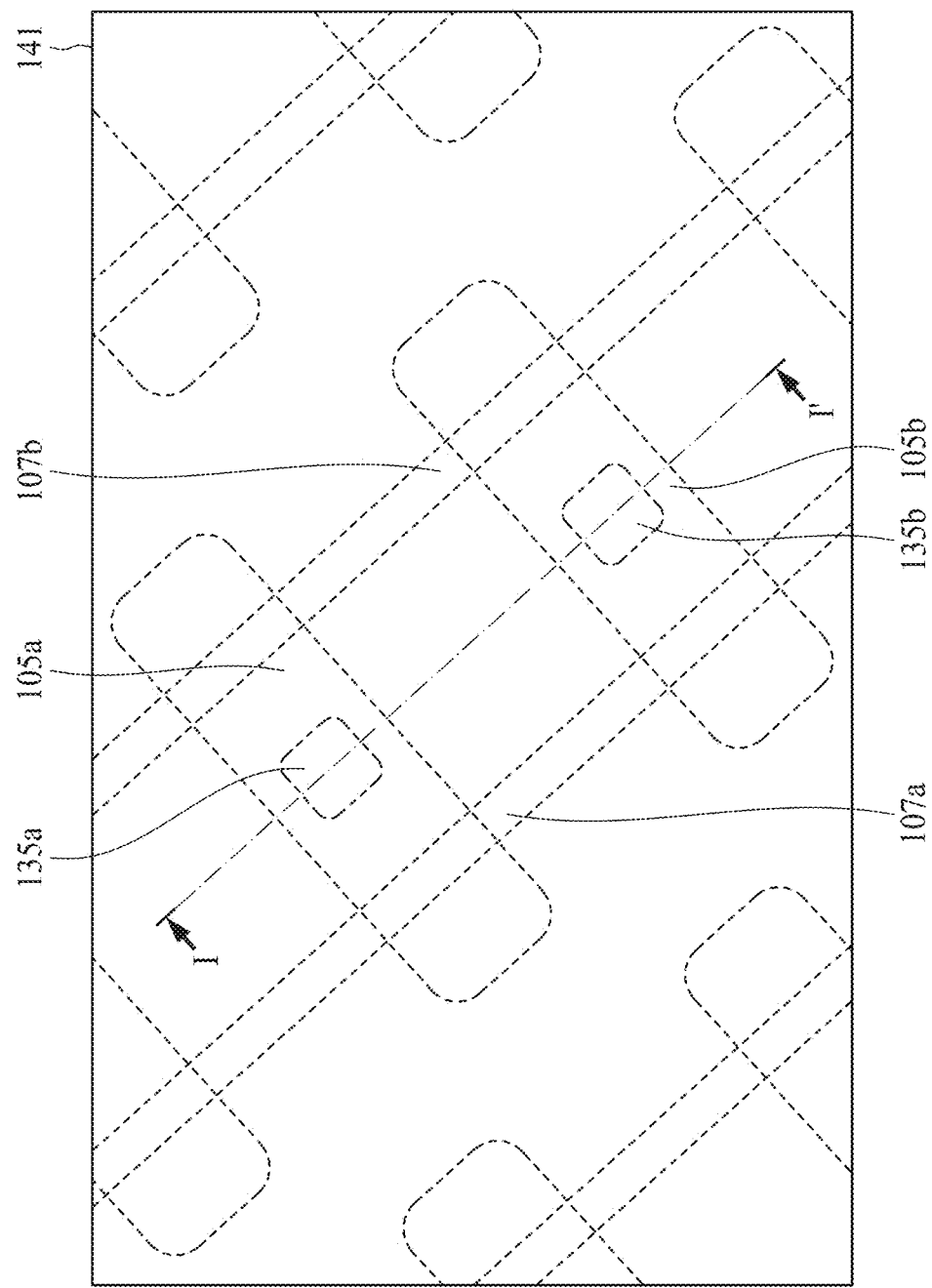
FIG. 14 is a top view illustrating an intermediate stage of forming a dielectric layer during the formation of the semiconductor device structure, in accordance with some embodiments.
Figure 15:
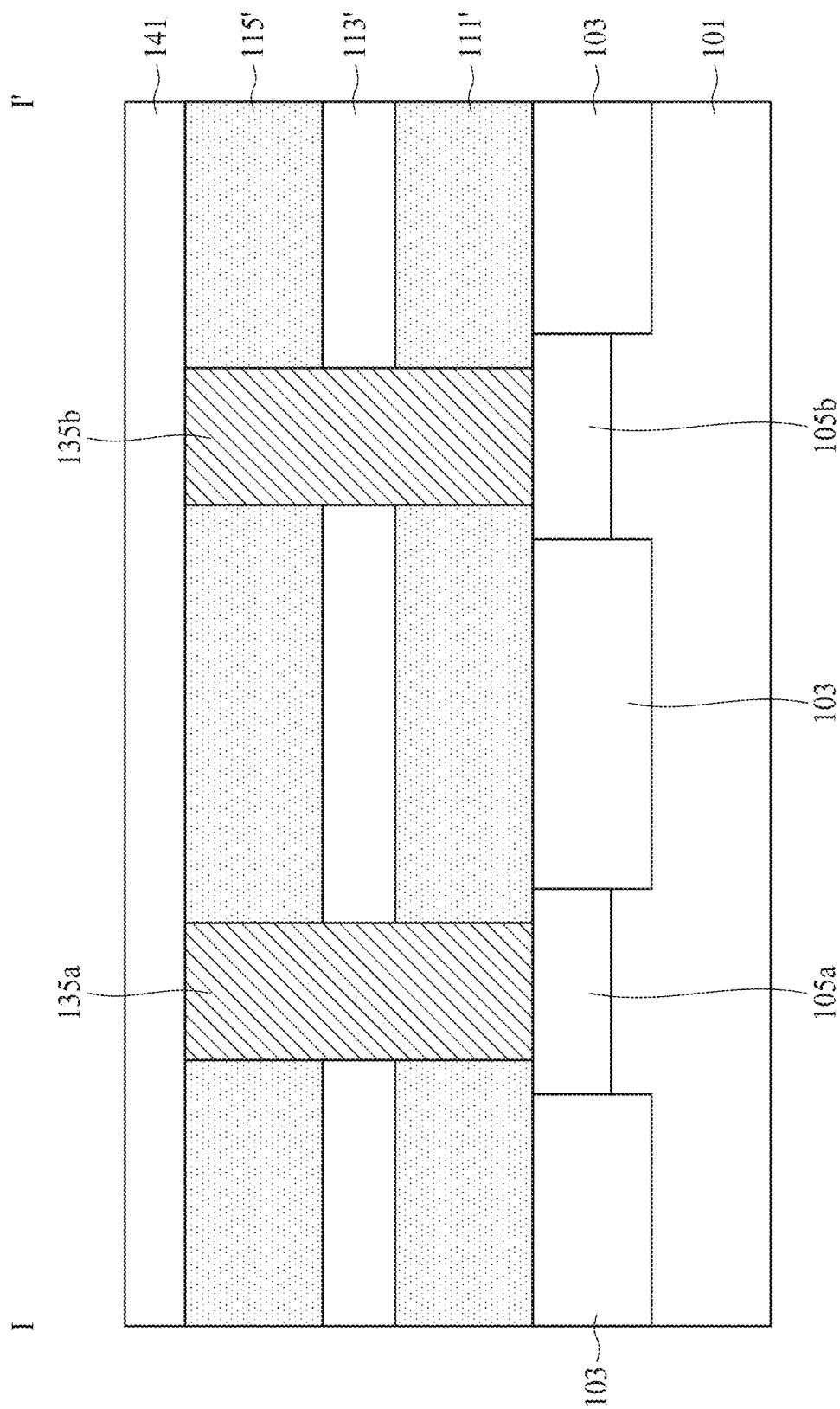
FIG. 15 is a cross-sectional view illustrating an intermediate stage of forming a dielectric layer during the formation of the semiconductor device structure along the sectional line I-I' in FIG. 14, in accordance with some embodiments.

After the conductive contacts 135a and 135b are formed, the second dielectric layer 141 is formed covering the second energy removable layer 115' and the conductive contacts 135a and 135b, as shown in FIGS. 14 and 15 in accordance with some embodiments. The respective step is illustrated as the step S17 in the method 10 shown in FIG. 3. It should be noted that the second dielectric layer 141 is configured to seal the air gap structures which will be formed subsequently.

In some embodiments, the second dielectric layer 141 and the first dielectric layer 113 are formed by the same material. In some embodiments, the second dielectric layer 141 is made of silicon oxide, silicon nitride, silicon oxynitride, or multilayers thereof. In some embodiments, the second dielectric layer 141 is made of a low-k dielectric material. In addition, the second dielectric layer 141 may be formed by a deposition processes, such as a CVD process, a PVD process, an ALD process, a spin-coating process, or another applicable process.

Figure 16:
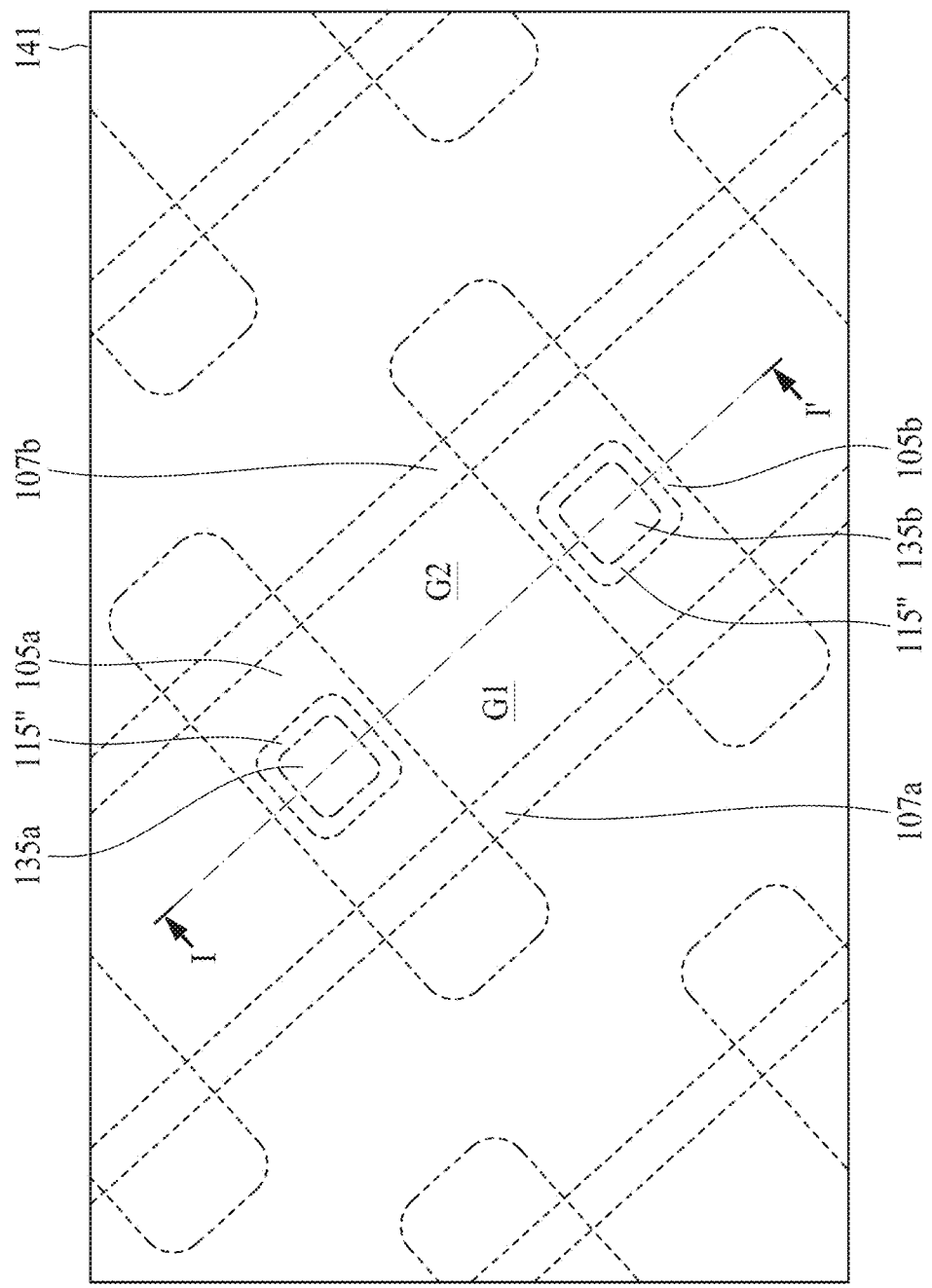
FIG. 16 is a top view illustrating an intermediate stage of forming air gap structures during the formation of the semiconductor device structure, in accordance with some embodiments.
Figure 17:
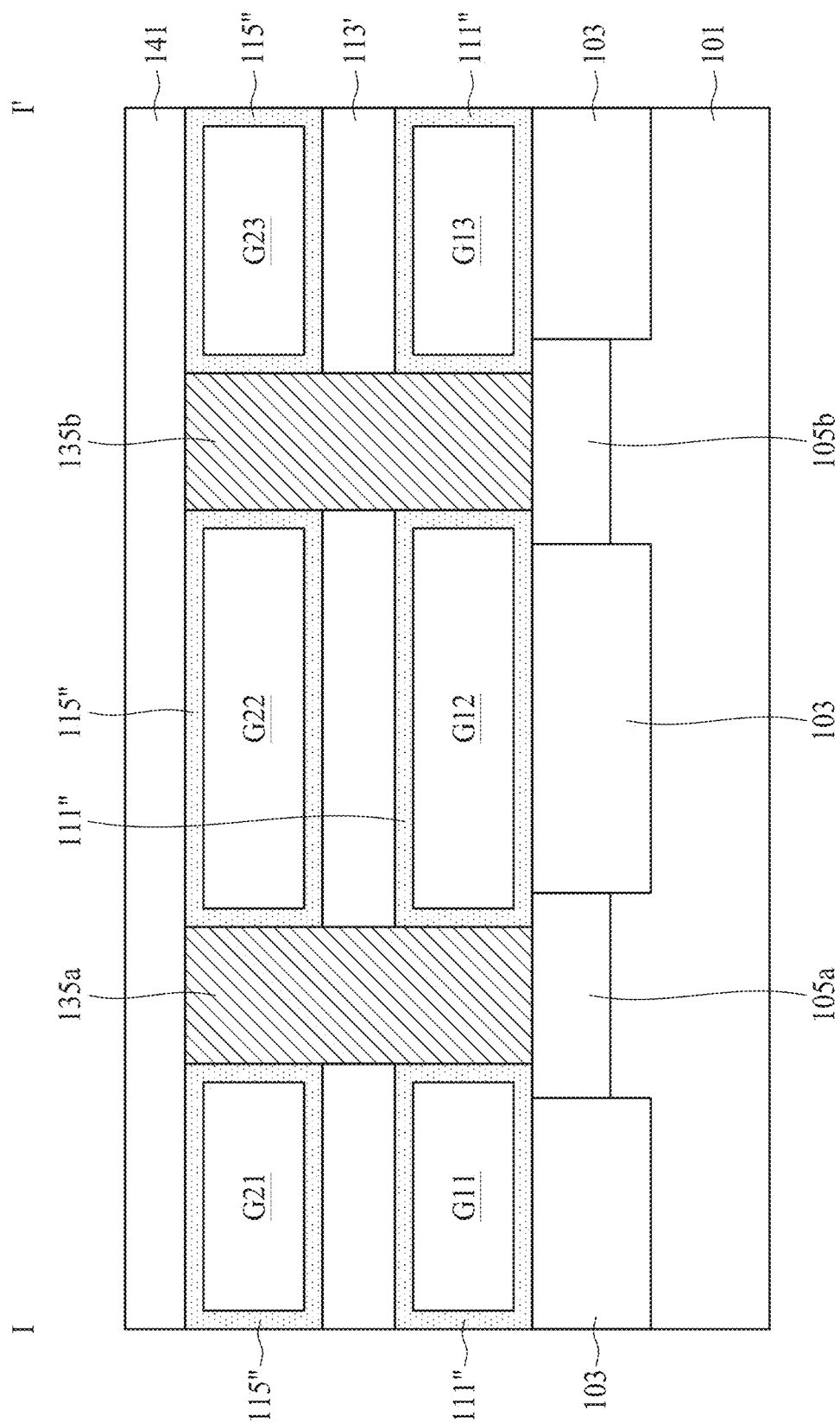
FIG. 17 is a cross-sectional view illustrating an intermediate stage of forming air gap structures during the formation of the semiconductor device structure along the sectional line I-I' in FIG. 16, in accordance with some embodiments.

After the second dielectric layer 141 is formed, a heat treatment process is performed, as shown in FIGS. 16 and 17 in accordance with some embodiments. In some embodiments, during the heat treatment process, the first energy removable layer 111' is transformed into the first energy removable structure 111" and the first air gap structure G1 enclosed by the first energy removable structure 111", and the second energy removable layer 115" is transformed into the second energy removable structure 115" and the second air gap structure G2 enclosed by the second energy removable structure 115". The respective step is illustrated as the step S19 in the method 10 shown in FIG. 3.

More specifically, in some embodiments, the heat treatment process is used to remove the decomposable porogen materials of the first energy removable layer 111' and the second energy removable layer 115' to generate pores, and the base materials of the first energy removable layer 111' and the second energy removable layer 115' are accumulated at the edges of the first energy removable layer 111' and the second energy removable layer 115'. The pores are filled by air after the decomposable porogen materials are removed, such that the air gap structures G1 and G2 are obtained inside the remaining portions of the first energy removable layer 111' and the second energy removable layer 115' (i.e., the first energy removable structure 111" and the second energy removable structure 115"), in accordance with some embodiments.

As shown in FIG. 17, the first air gap structure G1 includes three portions G11, G12 and G13, and the second air gap structure G2 includes three portions G21, G22 and G23. In some embodiments, the portions G12 and G22 are between the conductive contacts 135a and 135b. Since the portions G11, G12 and G13 are connected, the lower portions of the conductive contacts 135a and 135b are surrounded by the first air gap structure G1. Moreover, since the portions G21, G22 and G23 are connected, the upper portions of the conductive contacts 135a and 135b are surrounded by the second air gap structure G2. In addition, the middle portions of the conductive contacts 135a and 135b are surrounded by the first dielectric layer 113'.

In some embodiments, the first dielectric layer 113' separates the first energy removable structure 111" and the second energy removable structure 115". In some embodiments, since the first dielectric layer 113' is disposed between the first air gap structure G1 and the second air gap structure G2, the first dielectric layer 113' may provide additional structural support to the semiconductor device structure 100.

After the heat treatment process, the first energy removable structure 111" is in direct contact with the isolation structure 103, the S/D regions 105a, 105b, the conductive contacts 135a and 135b, and the first dielectric layer 113', in accordance with some embodiments. Moreover, the second energy removable structure 115" is in direct contact with the second dielectric layer 131, the conductive contacts 135a and 135b, and the first dielectric layer 113' in accordance with some embodiments.

In some alternative embodiments, the first energy removable layer 111' and the second energy removable layer 115' are transformed into the first air gap structure G1 and the second air gap structure G2, respectively. Thus, the first energy removable structure 111" and the second energy removable structure 115" are not formed. Alternatively, the first energy removable structure 111" and the second energy removable structure 115" are partially formed, such that the first air gap structure G1 and the second air gap structure G2 are not fully enclosed by the first energy removable structure 111" and the second energy removable structure 115", respectively, in accordance with some embodiments.

In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the first energy removable layer 111' and the second energy removable layer 115', such that the first energy removable structure 111", the first air gap structure G1, the second energy removable structure 115" and the second air gap structure G2 are obtained.

After the first air gap structure G1 and the second air gap structure G2 are formed, the conductive vias 145a and 145b are formed in the second dielectric layer 141, the third dielectric layer 151 is formed over the second dielectric layer 141, and the bit lines 155a and 155b are formed in the third dielectric layer 151, as shown in FIGS. 1 and 2 in accordance with some embodiments. The respective step is illustrated as the step S21 in the method 10 shown in FIG. 3.

In some embodiments, the conductive vias 145a, 145b and the bit lines 155a, 155b are made of copper (Cu), copper alloy, aluminum (Al), aluminum alloy, tungsten (W), tungsten alloy, titanium (Ti), titanium alloy, tantalum (Ta), tantalum alloy, or a combination thereof. Alternatively, other applicable conductive materials may be used. Moreover, the formation of the conductive vias 145a, 145b and the bit lines 155a, 155b may be formed by one or more patterning processes, and one or more deposition processes. The patterning process may be similar to, or the same as the patterning process for forming the word lines and details thereof are not repeated herein. The deposition process may be a CVD process, a PVD process, an ALD process, a metal organic CVD (MOCVD) process, a sputtering process, a plating process, or another applicable deposition process. After the deposition process, a planarization process, such as a chemical mechanical polishing (CMP) process may be performed. Some materials and processes used to form the third dielectric layer 151 are similar to, or the same as, those used to form the second dielectric layer 141, and details thereof are not repeated herein.

After the bit lines 155a and 155b are formed, the semiconductor device structure 100 is obtained. The semiconductor device structure 100 has the first air gap structure G1 and the second air gap structure G2 between the conductive contacts 135a and 135b, and the conductive contacts 135a and 135b are surrounded by the first air gap structure G1 and the second air gap structure G2. Therefore, the parasitic capacitance between the conductive contacts 135a and 135b may be reduced. As a result, the overall device performance may be improved (e.g., the decreased power consumption and signal delay).

Figure 18:
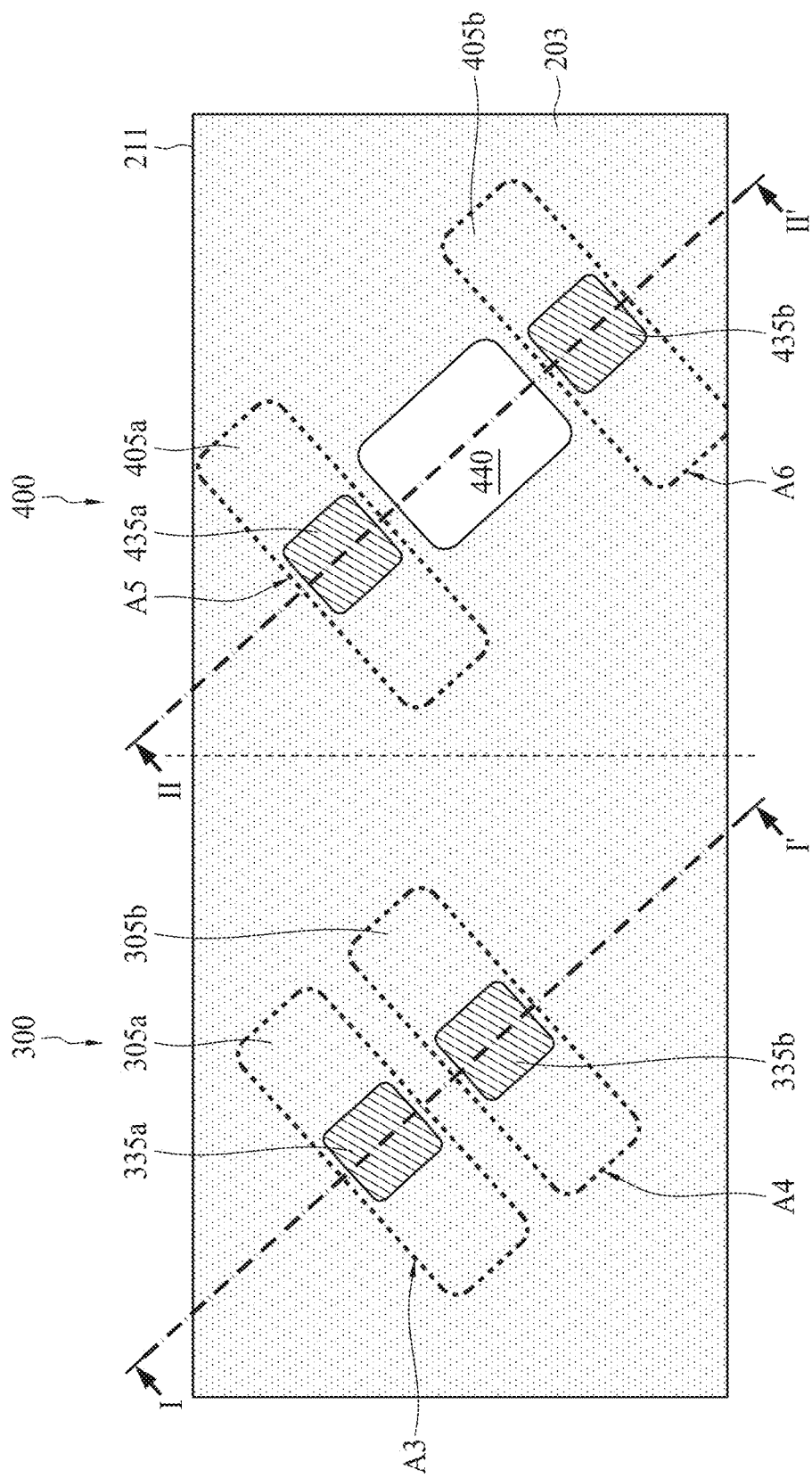
FIG. 18 is a top view illustrating an intermediate stage of forming an energy removable layer during the formation of a semiconductor device structure in a cell region and a semiconductor device structure in a peripheral region, in accordance with some embodiments.

FIG. 18 is a top view illustrating an intermediate stage during the formations of a semiconductor device structure in a cell region 300 and a semiconductor device structure in a peripheral region 400, and FIGS. 19, 20, 21 and 22 are cross-sectional views illustrating intermediate stages in the formations of the above-mentioned semiconductor device structures along the sectional lines I-I' and II-II' in FIG. 18, in accordance with some embodiments.

Figure 19:
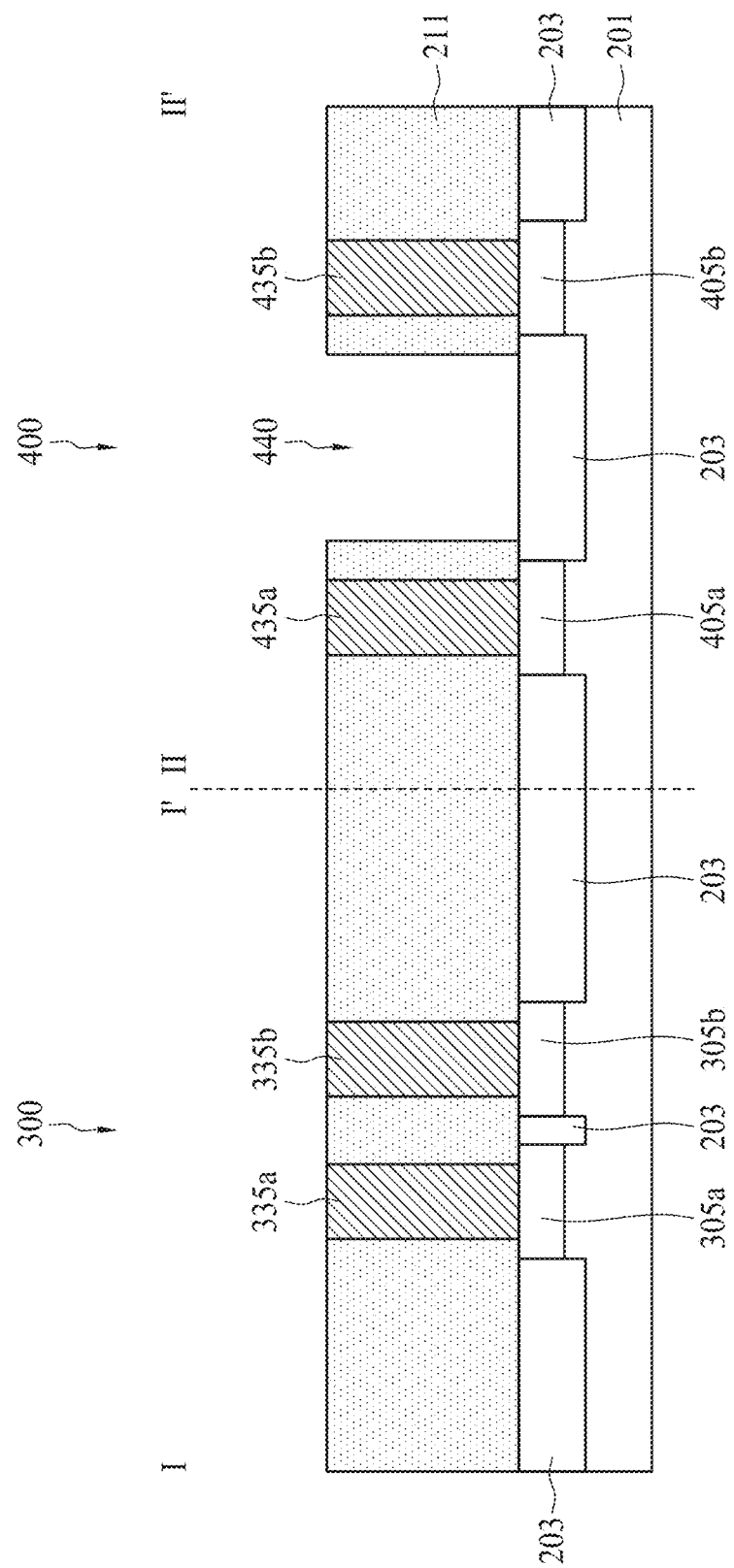
FIG. 19 is a cross-sectional view illustrating an intermediate stage of forming the energy removable layer during the formation of the semiconductor device structure in the cell region and the semiconductor device structure in the peripheral region along the sectional lines I-I' and II-II' in FIG. 18, in accordance with some embodiments.

As shown in FIGS. 18 and 19, an isolation structure 203 is formed in a semiconductor substrate 201, and active areas are defined by the isolation structure 203, in accordance with some embodiments. For example, active areas A3, A4 are defined in the cell region 300, and active areas A5, A6 are defined in the peripheral region 400. The cell region 300 and the peripheral region 400 are separated by the dashed line. The semiconductor substrate 201, the isolation structure 203 and the active areas A3, A4, A5 and A6 may be similar to, or the same as the semiconductor substrate 101, the isolation structure 103 and the active areas A1 and A2 (see FIGS. 1 and 2) and details thereof are not repeated herein.

It should be noted that, compared with the active areas (e.g., the active areas A5 and A6) in the peripheral region 400, the active areas (e.g., the active areas A3 and A4) in the cell region 300 are closer to each other. In some embodiments, conductive structures 335a and 335b are disposed over S/D regions 305a and 305b in the cell region 300, and conductive structures 435a and 435b are disposed over S/D regions 405a and 405b in the peripheral region 400. The S/D regions 305a, 305b, 405a, 405b, and the conductive contacts 335a, 335b, 435a, 435b may be similar to, or the same as the S/D regions 105a, 105b and the conductive contacts 135a, 135b (see FIGS. 1 and 2) and details thereof are not repeated herein.

Still referring to FIGS. 18 and 19, an energy removable layer 211 is formed over the semiconductor substrate 201, in accordance with some embodiments. The energy removable layer 211 may be similar to, or the same as the first energy removable layer 111 and the second energy removable layer 115 (see FIGS. 6 and 7) and details thereof are not repeated herein. Since the distance between the conductive contacts 435a and 435b in the peripheral region 400 is greater than the distance between the conductive contacts 335a and 335b in the cell region 300, the energy removable layer 211 may have an opening 440 between the conductive contacts 435a and 435b, and the isolation structure 203 is partially exposed by the opening 440.

Figure 20:
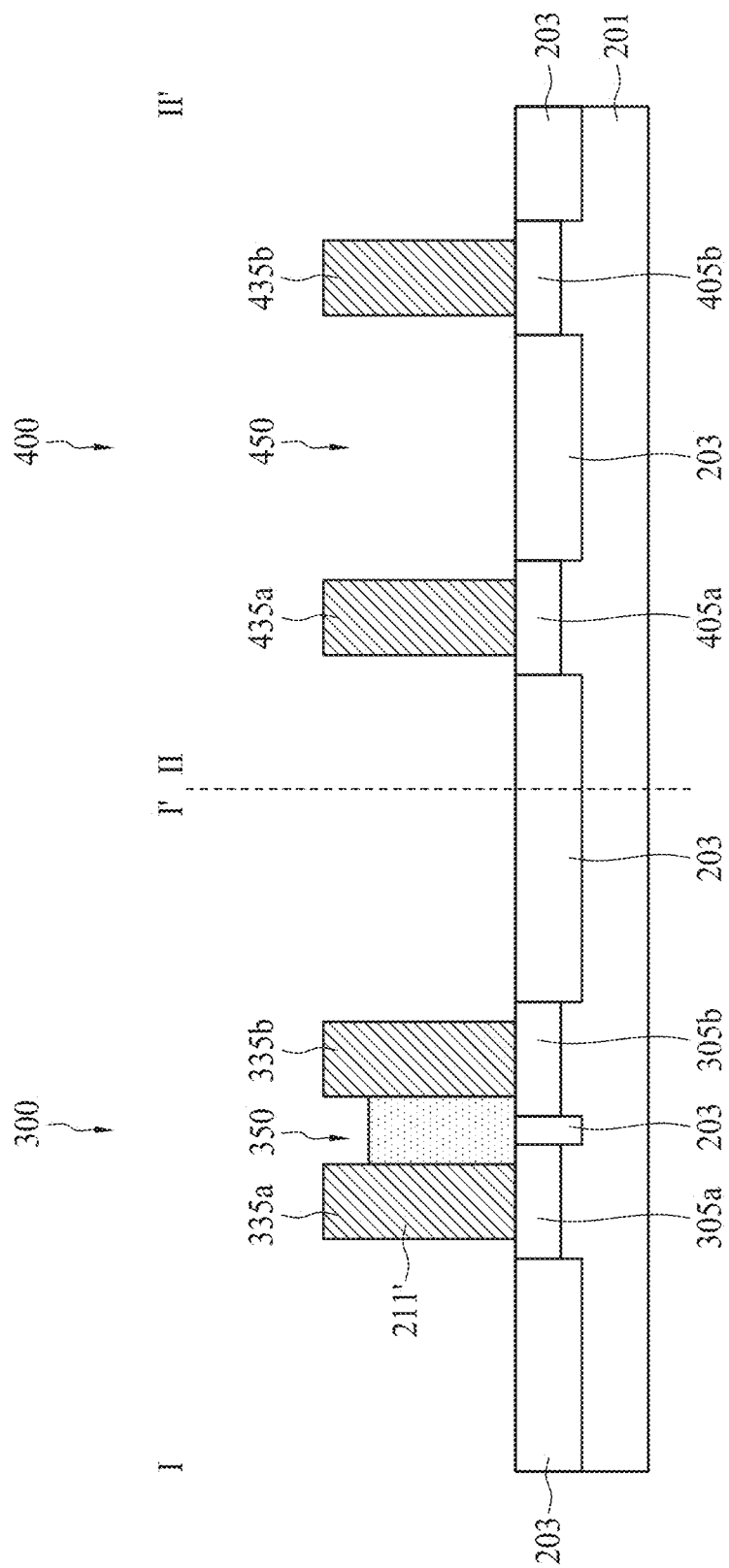
FIG. 20 is a cross-sectional view illustrating an intermediate stage of etching back the energy removable layer during the formation of the semiconductor device structure in the cell region and the semiconductor device structure in the peripheral region along the sectional lines I-I' and II-II' in FIG. 18, in accordance with some embodiments.

Next, the energy removable layer 211 is etched back, as shown in FIG. 20 in accordance with some embodiments. Since the distance between the conductive contacts 335a and 335b is less than the distance between the conductive contacts 435a and 435b, a lower portion of the energy removable layer 211 remains between the conductive contacts 335a and 335b after the etching process. As a result, an opening 350 is obtained over the remaining energy removable portion 211' in the cell region 300, while the conductive contacts 435a and 435b in the peripheral region 400 are separated from each other by an opening 450 (enlarged from the opening 440). The etching process may be a wet etching process, a dry etching process, or a combination thereof.

Figure 21:
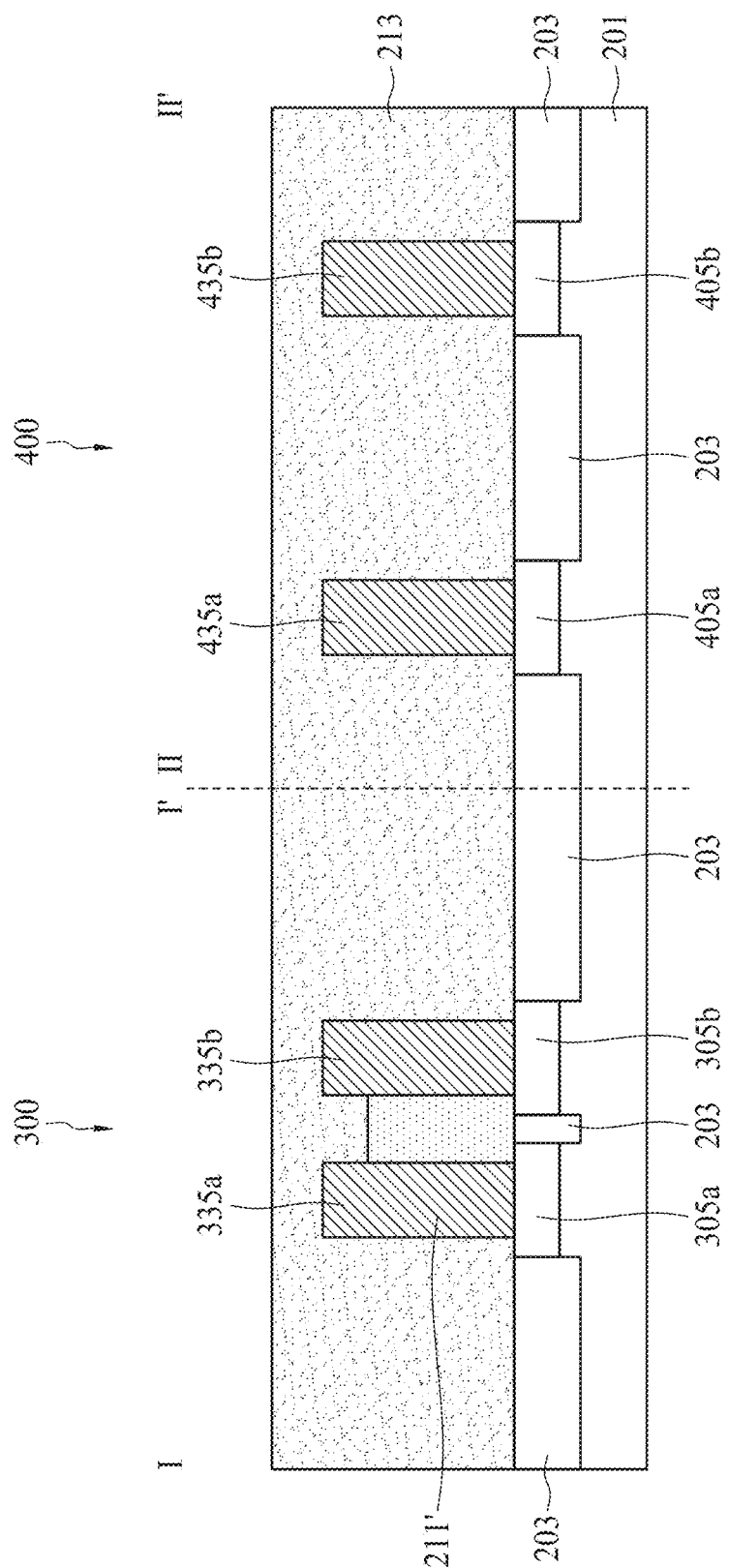
FIG. 21 is a cross-sectional view illustrating an intermediate stage of forming a dielectric layer during the formation of the semiconductor device structure in the cell region and the semiconductor device structure in the peripheral region along the sectional lines I-I' and II-II' in FIG. 18, in accordance with some embodiments.

Then, a dielectric layer 213 is formed to cover the semiconductor substrate 201, the conductive contacts 335a, 335b, 435a, 435b and the remaining energy removable portion 211', as shown in FIG. 21 in accordance with some embodiments. The dielectric layer 213 may be similar to, or the same as the first dielectric layer 113 (see FIGS. 6 and 7) and details thereof are not repeated herein. It should be noted that, the openings 350 and 450 are filled by the dielectric layer 213, and the structure in the cell region 300 and the structure in the peripheral region 400 are entirely covered by the dielectric layer 213.

Figure 22:
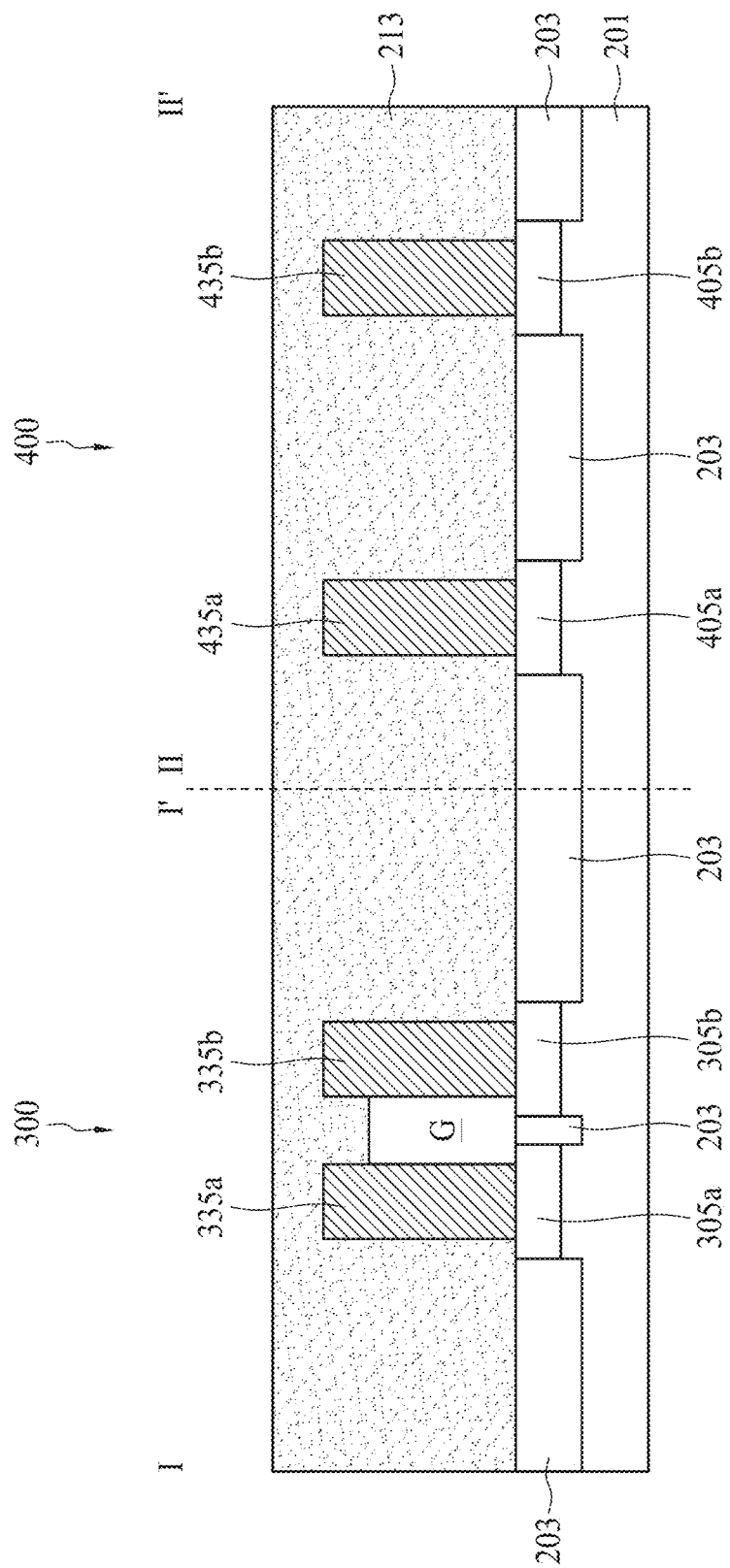
FIG. 22 is a cross-sectional view illustrating an intermediate stage of forming an air gap structure during the formation of the semiconductor device structure in the cell region and the semiconductor device structure in the peripheral region along the sectional lines I-I' and II-II' in FIG. 18, in accordance with some embodiments.

After the dielectric layer 213 is formed, a heat treatment process is performed, as shown in FIG. 22 in accordance with some embodiments. In some embodiments, during the heat treatment process, the remaining energy removable portion 211' is transformed into an air gap structure G. In some alternative embodiments, the remaining energy removable portion 211' is transformed into an energy removable structure (not shown) and an air gap structure enclosed by the energy removable structure.

More specifically, the air gap structure G is sealed by the dielectric layer 213, and a portion of the dielectric layer 213 extends into the space between the conductive contacts 335a and 335b, in accordance with some embodiments. In other words, the top surface of the air gap structure G is lower than the top surfaces of the conductive contacts 335a and 335b.

It should be noted that an air gap structure (i.e., the air gap structure G) is formed in the semiconductor device structure of the cell region 300, while no air gap structure exists in the semiconductor device structure of the peripheral region 400. By utilizing the different distances between the conductive contacts in the cell region 300 and the peripheral region 400, air gap structure(s) may be selectively formed in the cell region 300 (i.e., the pattern-dense region).

Figure 23:
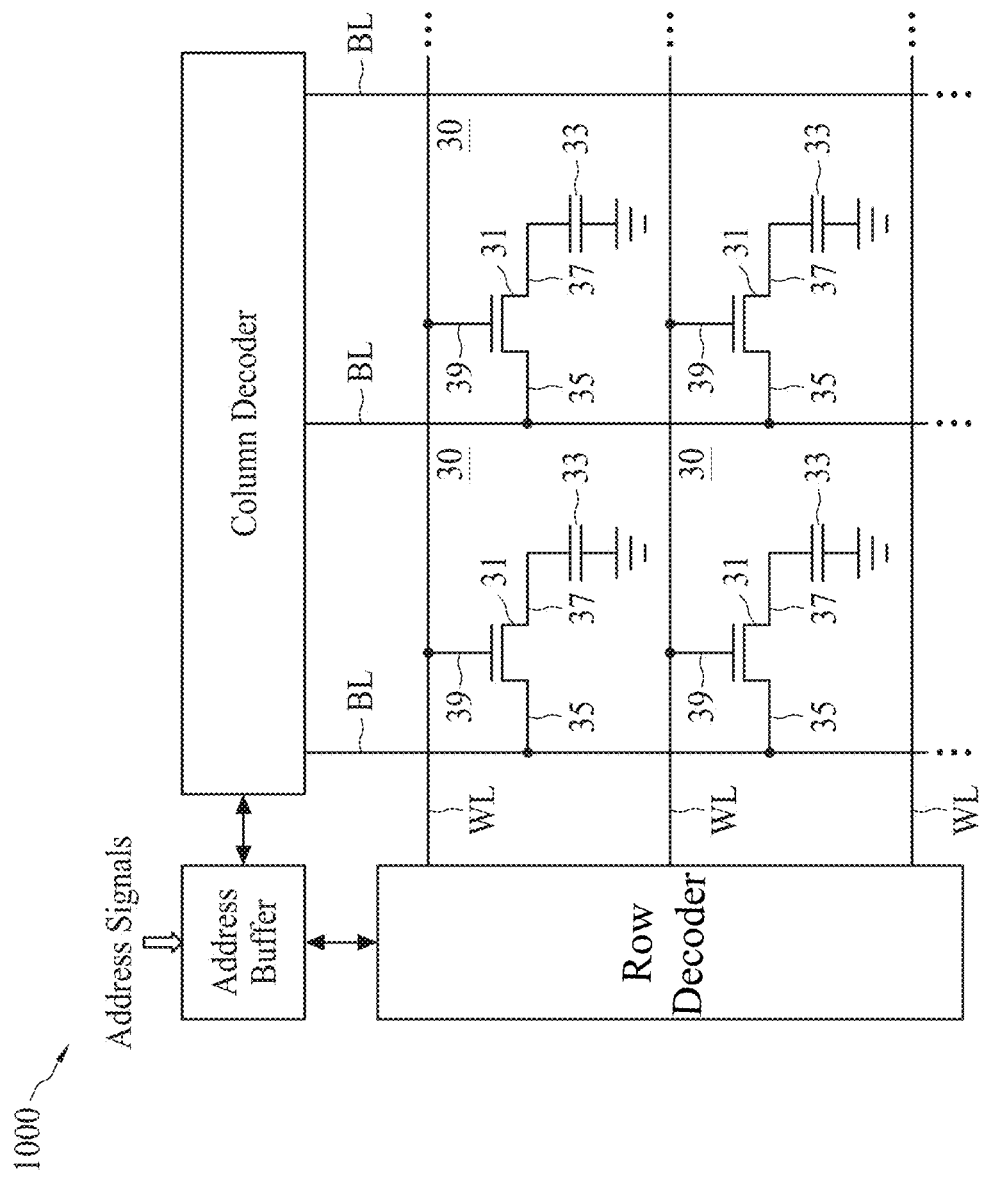
FIG. 23 is a partial schematic illustration of an exemplary integrated circuit, including an array of memory cells in accordance with some embodiments.

FIG. 23 is a partial schematic illustration of an exemplary integrated circuit, such as a memory device 1000, including an array of memory cells 30 in accordance with some embodiments. In some embodiments, the memory device 1000 includes a dynamic random access memory (DRAM) device. In some embodiments, the memory device 1000 includes a number of memory cells 30 arranged in a grid pattern and including a number of rows and columns. The number of memory cells 30 may vary depending on system requirements and fabrication technology.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage at the gate 39 via the word line WL, a voltage potential may be created across the FET 30 such that the electrical charge can flow from the drain 35 to the capacitor 33. Therefore, the electrical charge stored in the capacitor 33 may be interpreted as a binary data value in the memory cell 30. For example, a positive charge above a threshold voltage stored in the capacitor 33 may be interpreted as binary "1." If the charge in the capacitor 33 is below the threshold value, a binary value of "0" is said to be stored in the memory cell 30.

The bit lines BL are configured to read and write data to and from the memory cells 30. The word lines WL are configured to activate the field effect transistors (FET) 31 to access a particular row of the memory cells 30. Accordingly, the memory device 1000 also includes a periphery region which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Referring back to FIGS. 18 to 22, the air gap structure G is formed in the semiconductor device structure in the cell region 300 (i.e., the pattern-dense region), while no air gap structure is formed in the semiconductor device structure in the peripheral region 400 (i.e., the pattern-loose region). The cell region 300 may be the regions of the memory cells 30 of the memory device 1000 in FIG. 23, and the peripheral region 400 may be the regions of the address buffer, the row decoder, or the column decoder of the memory device 1000 in FIG. 23.

Embodiments of the semiconductor device structure 100 are provided in the disclosure. The semiconductor device structure 100 includes a plurality of conductive contacts (e.g., the conductive contacts 135a and 135b) disposed over the semiconductor substrate 101, the first dielectric layer 113' surrounding the conductive contacts, and the second dielectric layer 141 disposed over the conductive contacts. Particularly, the first dielectric layer 113' is separated from the semiconductor substrate 101 by a first air gap structure G1, and the first dielectric layer 113' is separated from the second dielectric layer 141 by a second air gap structure G2. Therefore, the parasitic capacitance between the conductive contacts may be reduced. Moreover, the first dielectric layer 113' between the first air gap structure G1 and the second air gap structure G2 may provide additional structural support to the semiconductor device structure 100. As a result, the overall device performance may be improved (i.e., the decreased power consumption and resistive-capacitive (RC) delay), and the yield rate of the semiconductor device may be increased.

In one embodiment of the present disclosure, a semiconductor device structure is provided. The semiconductor device structure includes a first conductive contact and a second conductive contact disposed over a semiconductor substrate. The semiconductor device structure also includes a first dielectric layer surrounding the first conductive contact and the second conductive contact, and a second dielectric layer disposed over the first conductive contact, the second conductive contact and the first dielectric layer. The first dielectric layer is separated from the semiconductor substrate by a first air gap structure, and the first dielectric layer is separated from the second dielectric layer by a second air gap structure.

In another embodiment of the present disclosure, a semiconductor device structure is provided. The semiconductor device structure includes a first conductive contact disposed over a first source/drain region of a semiconductor substrate. The semiconductor device structure also includes a first energy removable structure adjoins a lower portion of a sidewall of the first conductive contact. A first air gap structure is enclosed by the first energy removable structure. The semiconductor device structure further includes a second energy removable structure adjoins an upper portion of the sidewall of the first conductive contact. A second air gap structure is enclosed by the second energy removable structure. In addition, the semiconductor device structure includes a first dielectric layer disposed between the first energy removable structure and the second energy removable structure. The first dielectric layer adjoins a middle portion of the sidewall of the first conductive contact.

In yet another embodiment of the present disclosure, a method for forming a semiconductor device structure is provided. The method includes forming a first energy removable layer over a semiconductor substrate, and forming a first dielectric layer over the first energy removable layer. The method also includes forming a second energy removable layer over the first dielectric layer, and forming a conductive contact penetrating through the first energy removable layer, the first dielectric layer and the second energy removable layer. The method further includes performing a heat treatment process to transform the first energy removable layer into a first energy removable structure and to transform the second energy removable layer into a second energy removable structure. A first air gap structure is enclosed by the first energy removable structure and a second air gap structure is enclosed by the second energy removable structure.

The embodiments of the present disclosure have some advantageous features. By forming air gap structures between the adjacent conductive contacts, the parasitic capacitance between the conductive contacts may be reduced. Moreover, since the air gap structures are separated from each other by a dielectric layer, the dielectric layer may provide additional structural support to the semiconductor device. These significantly improve the overall device performance and increase the yield rate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
    a first conductive contact and a second conductive contact disposed over a semiconductor substrate;
    a first dielectric layer surrounding the first conductive contact and the second conductive contact; and
    a second dielectric layer disposed over the first conductive contact, the second conductive contact and the first dielectric layer, wherein the first dielectric layer is separated from the semiconductor substrate by a first air gap structure, and the first dielectric layer is separated from the second dielectric layer by a second air gap structure.

2. The semiconductor device structure of claim 1, wherein the first dielectric layer, the first air gap structure and the second air gap structure extend between the first conductive contact and the second conductive contact.

3. The semiconductor device structure of claim 1, wherein the first dielectric layer is in direct contact with the first conductive contact and the second conductive contact.

4. The semiconductor device structure of claim 1, further comprising:
    a first energy removable structure disposed between the first dielectric layer and the semiconductor substrate, wherein the first air gap structure is enclosed by the first energy removable structure.

5. The semiconductor device structure of claim 4, wherein the first energy removable structure is in direct contact with the first conductive contact, the second conductive contact, the first dielectric layer and an isolation structure in the semiconductor substrate.

6. The semiconductor device structure of claim 1, further comprising:
    a second energy removable structure disposed between the first dielectric layer and the second dielectric layer, wherein the second air gap structure is enclosed by the second energy removable structure.

7. The semiconductor device structure of claim 6, wherein the second energy removable structure is in direct contact with the first conductive contact, the second conductive contact, the first dielectric layer and the second dielectric layer.

8. The semiconductor device structure of claim 1, further comprising:
    a first bit line and a second bit line disposed over the second dielectric layer, wherein the first bit line is electrically connected to a first source/drain region in the semiconductor substrate through the first conductive contact, and the second bit line is electrically connected to a second source/drain region in the semiconductor substrate through the second conductive contact.

9. A semiconductor device structure, comprising:
    a first conductive contact disposed over a first source/drain region of a semiconductor substrate;
    a first energy removable structure adjoins a lower portion of a sidewall of the first conductive contact, wherein a first air gap structure is enclosed by the first energy removable structure;
    a second energy removable structure adjoins an upper portion of the sidewall of the first conductive contact, wherein a second air gap structure is enclosed by the second energy removable structure; and
    a first dielectric layer disposed between the first energy removable structure and the second energy removable structure, wherein the first dielectric layer adjoins a middle portion of the sidewall of the first conductive contact.

10. The semiconductor device structure of claim 9, wherein the first conductive contact is surrounded by the first energy removable structure, the first dielectric layer and the second energy removable structure.

11. The semiconductor device structure of claim 9, wherein the first dielectric layer is in direct contact with the first energy removable structure and the second energy removable structure.

12. The semiconductor device structure of claim 9, further comprising:
a second conductive contact disposed over a second source/drain region of the semiconductor substrate, wherein the second conductive contact is surrounded by the first energy removable structure, the first dielectric layer and the second energy removable structure.

13. The semiconductor device structure of claim 12, wherein the first air gap structure and the second air gap structure extend between the first conductive contact and the second conductive contact.

14. The semiconductor device structure of claim 9, further comprising:
a conductive via disposed over the first conductive contact; and
a second dielectric layer disposed over the second energy removable structure, wherein the conductive via is surrounded by the second dielectric layer, and the first conductive contact is partially covered by the second dielectric layer.

15. The semiconductor device structure of claim 14, wherein the second air gap structure is separated from the second dielectric layer by the second energy removable structure.

16. A method for forming a semiconductor device structure, comprising:
forming a first energy removable layer over a semiconductor substrate;
forming a first dielectric layer over the first energy removable layer;
forming a second energy removable layer over the first dielectric layer;
forming a conductive contact penetrating through the first energy removable layer, the first dielectric layer and the second energy removable layer; and
performing a heat treatment process to transform the first energy removable layer into a first energy removable structure and to transform the second energy removable layer into a second energy removable structure, wherein a first air gap structure is enclosed by the first energy removable structure and a second air gap structure is enclosed by the second energy removable structure.

17. The method for forming a semiconductor device structure of claim 16, wherein a material of the first energy removable layer is the same as a material of the second energy removable layer, and the first air gap structure overlaps the second air gap structure in a top view.

18. The method for forming a semiconductor device structure of claim 16, wherein the step of forming the conductive contact comprises:
etching the first energy removable layer, the first dielectric layer and the second energy removable layer to form an opening exposing a source/drain region in the semiconductor substrate; and
forming the conductive contact in the opening before the heat treatment process is performed.

19. The method for forming a semiconductor device structure of claim 16, further comprising:
forming a second dielectric layer over the second energy removable layer and the conductive contact before the heat treatment process is performed.

20. The method for forming a semiconductor device structure of claim 19, further comprising:
forming a conductive via over the conductive contact after the heat treatment process is performed, wherein the conductive via is surrounded by the second dielectric layer; and
forming a bit line over the conductive via, wherein a portion of the second dielectric layer extends between the bit line and the conductive contact, and the bit line is electrically connected to a source/drain region in the semiconductor substrate through the conductive via and the conductive contact.

* * * * *